(12) United States Patent
Kajita et al.

(10) Patent No.: US 11,094,548 B2
(45) Date of Patent: Aug. 17, 2021

(54) APPARATUS FOR CLEANING SUBSTRATE AND SUBSTRATE CLEANING METHOD

(71) Applicant: EBARA CORPORATION

(72) Inventors: Shinji Kajita, Tokyo (JP); Hisajiro Nakano, Tokyo (JP); Tomoatsu Ishibashi, Tokyo (JP); Koichi Fukaya, Tokyo (JP); Yasuyuki Motoshima, Tokyo (JP); Yohei Eto, Tokyo (JP); Fumitoshi Oikawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 113 days.

(21) Appl. No.: 16/313,442

(22) PCT Filed: Jun. 26, 2017

(86) PCT No.: PCT/JP2017/023328
§ 371 (c)(1),
(2) Date: Dec. 26, 2018

(87) PCT Pub. No.: WO2018/003718
PCT Pub. Date: Jan. 4, 2018

(65) Prior Publication Data
US 2019/0164769 A1 May 30, 2019

(30) Foreign Application Priority Data

Jun. 27, 2016 (JP) .............................. JP2016-126429
Jun. 12, 2017 (JP) .............................. JP2017-115202

(51) Int. Cl.
*H01L 21/304* (2006.01)
*H01L 21/67* (2006.01)
(Continued)

(52) U.S. Cl.
CPC ...... *H01L 21/304* (2013.01); *H01L 21/02041* (2013.01); *H01L 21/6708* (2013.01);
(Continued)

(58) Field of Classification Search
CPC ......... H01L 21/67051; H01L 21/68728; H01L 21/6708; H01L 21/6715; H01L 21/68714
See application file for complete search history.

(56) References Cited

U.S. PATENT DOCUMENTS 6,115,867 A * 9/2000 Nakashima ....... H01L 21/67046
15/77
6,167,583 B1 1/2001 Miyashita et al.
(Continued)

FOREIGN PATENT DOCUMENTS

JP   H10-321572 A   12/1998
JP   H11-251284 A    9/1999
(Continued)

OTHER PUBLICATIONS

International Patent Application No. PCT/JP2017/023328; Int'l Search Report; dated Sep. 12, 2017; 4 pages.
(Continued)

*Primary Examiner* — Natasha N Campbell
(74) *Attorney, Agent, or Firm* — BakerHostetler

(57) ABSTRACT

An apparatus for cleaning a substrate has a holding unit 60 that holds a substrate W; a rotated unit 30 connected to the holding unit 60; a rotating unit 35 that is provided on a peripheral outer side of the rotated unit 30 and rotates the rotated unit 30; and a cleaning unit 10, 20 that physically cleans the substrate W held by the holding unit 60.

21 Claims, 22 Drawing Sheets

(51) Int. Cl.
*H01L 21/687* (2006.01)
*H01L 21/02* (2006.01)

(52) U.S. Cl.
CPC .... *H01L 21/6715* (2013.01); *H01L 21/67028* (2013.01); *H01L 21/67051* (2013.01); *H01L 21/68714* (2013.01); *H01L 21/68728* (2013.01)

(56) References Cited

U.S. PATENT DOCUMENTS

| | | | |
|---|---|---|---|
| 2009/0101181 A1 | 4/2009 | Morisawa et al. | |
| 2011/0136411 A1* | 6/2011 | Nakanishi | B24B 21/002 451/41 |
| 2014/0097580 A1* | 4/2014 | Lach | H01L 21/67051 279/123 |
| 2014/0238443 A1* | 8/2014 | Lee | H01L 21/6708 134/21 |

FOREIGN PATENT DOCUMENTS

| | | |
|---|---|---|
| JP | 2000-183009 A | 6/2000 |
| JP | 2007-330927 A | 12/2007 |
| JP | 2009-117794 A | 5/2009 |
| JP | 2015-153761 A | 8/2015 |

OTHER PUBLICATIONS

Japan Patent Application No. 2017-115202; Notice of Reasons for Refusal; dated Sep. 8, 2020; 8 pages.

* cited by examiner

← PERIPHERAL INNER SIDE

APPARATUS FOR CLEANING SUBSTRATE AND SUBSTRATE CLEANING METHOD

TECHNICAL FIELD

The present invention relates to an apparatus for cleaning a substrate and a substrate cleaning method for processing substrates, such as a semiconductor wafer.

BACKGROUND ART

There has conventionally been known an apparatus for cleaning a substrate that cleans a surface (first surface) of a substrate. As an example, there has been known an apparatus for cleaning a substrate having a chuck that holds a substrate, and a rotation mechanism that rotates a substrate held by the chuck (Patent Literature 1). In such a substrate processing and cleaning apparatus, a member that fixes and supports the chuck is provided on a back surface (second surface) side of a substrate as shown in FIG. 1 of Patent Literature 1. Accordingly, rotation of the chuck causes turbulence of an air current. Furthermore, there is also a problem that the back surface (second surface) of a substrate cannot be cleaned.

On the other hand, in order to reduce such turbulence in an air current described above and also clean a back surface of a substrate, an apparatus for cleaning a substrate having a rotating support unit that supports a substrate while rotating it is sometimes used (Patent Literature 2). However, such a rotating support unit, in which dust is sometimes generated between a rotating substrate and the rotating support unit, has not been suitable particularly for final cleaning of a substrate.

CITATION LIST

Patent Literature

Patent Literature 1: JP 2015-153761 A
Patent Literature 2: JP H10-321572 A

SUMMARY OF INVENTION

Technical Problem

The present invention is made in view of the above points, and provides an apparatus for cleaning a substrate and a substrate cleaning method that reduce turbulence of an air current, allow a back surface (second surface) side of a substrate to be cleaned in a comparatively easy manner, and generate little dust.

Solution to Problem

An apparatus for cleaning a substrate according to the present invention may comprise:
a holding unit that holds the substrate;
a rotated unit connected to the holding unit;
a rotating unit that is provided on a peripheral outer side of the rotated unit and rotates the rotated unit; and
a cleaning unit that physically cleans the substrate held by the holding unit.

In the apparatus for cleaning the substrate according to the present,
the rotating unit may rotate the rotated unit in a non-contacting state with the rotated unit.

In the apparatus for cleaning the substrate according to the present,
the cleaning unit may have a first cleaning unit that physically cleans a first surface of the substrate and a second cleaning unit that physically cleans a second surface on an opposite side of the first surface.

In the apparatus for cleaning the substrate according to the present,
the cleaning unit physically may clean the substrate with 0.3 N or larger and 3 N or lower.

In the apparatus for cleaning the substrate according to the present,
the cleaning unit may have a fluid jet cleaning unit that jets two fluids to the substrate.

The apparatus for cleaning the substrate according to the present invention may further comprise
a rotation cup connected to the holding unit or the rotated unit, and
a fixing cup provided on a peripheral outer side of the rotation cup, wherein
the cleaning unit may have a first cleaning unit that physically cleans a first surface of the substrate,
the first cleaning unit may have a first arm that swings around a first swinging shaft, and a first cleaning member that is provided on a front-end side of the first arm and extends toward a side of the substrate and
the first cleaning member may be positioned at a position away from the substrate relative to a front end of the fixing cup in a normal direction of the substrate and on a peripheral outer side of a front end of the fixing cup at a time of standby.

In the apparatus for cleaning the substrate according to the present,
the cleaning unit may have a second cleaning unit that physically cleans a second surface of the substrate,
the second cleaning unit may have a second arm that swings around a second swinging shaft, and a second cleaning member that is provided on a front-end side of the second arm and extends toward a side of the substrate and
the second cleaning unit may be positioned at a position away from the substrate relative to the rotated unit in a normal direction of the substrate at a time of standby.

In the apparatus for cleaning the substrate according to the present,
the holding unit may have a holding member that holds the substrate and an elastic member that provides a biasing force to the holding member, and
the apparatus for cleaning the substrate may further comprise an opening device that makes the holding member in an open state by providing a force opposite to a biasing force applied by the elastic member.

In the apparatus for cleaning the substrate according to the present,
the opening device may approach the holding unit from a front surface side of the substrate and makes the holding member in the open state.

In the apparatus for cleaning the substrate according to the present,
the opening device may have a support member that supports a back surface of the substrate when the holding member is in the open state.

In the apparatus for cleaning the substrate according to the present,
the support member may approach from a front surface side of the substrate, move to a back-surface side of the substrate, be positioned on the back-surface side of the substrate before the holding member becomes in the open state, and support the back surface of the substrate when the holding member is in the open state.

The apparatus for cleaning the substrate according to the present invention may further comprise a rotation cup connected to the holding unit or the rotated unit, wherein the support member may be positioned on the back-surface side of the substrate after passing through a peripheral inner side of the rotation cup and a peripheral outer side of the substrate.

In the apparatus for cleaning the substrate according to the present, the opening device may have a pressing member that moves along an in-plane direction of the substrate, the holding unit may have a pressed member pressed by the pressing member, and the holding member may become in the open state by the pressed member being pressed by the pressing member.

The apparatus for cleaning the substrate according to the present invention may further comprise a rotation cup connected to the holding unit or the rotated unit, wherein the pressed member may be provided between an inner periphery of the rotation cup and an outer periphery of the substrate when viewed from a front surface side of the substrate.

In the apparatus for cleaning the substrate according to the present, the holding unit may have a swinging shaft that has the holding member swing along an in-plane direction of the substrate.

In the apparatus for cleaning the substrate according to the present, the holding unit may have a weight member provided closer to a base end relative to the swinging shaft.

In the apparatus for cleaning the substrate according to the present, the holding unit may have a plurality of holding members, and a first biasing force provided to a certain holding member may be larger than a second biasing force provided to another holding member.

In the apparatus for cleaning the substrate according to the present, the holding unit may have a regulated unit for regulating movement to an inner peripheral side of the holding member, the rotated unit may have a regulating unit for regulating movement of the regulated unit, and movement of a holding member, provided with the first biasing force, to an inner side may be regulated by the regulating unit on a peripheral outer side relative to a holding member provided with the second biasing force.

The apparatus for cleaning the substrate according to the present invention may further comprise a member including a conductive fiber and being provided adjacent to the holding unit.

A substrate cleaning method according to the present invention may comprise the steps of:

holding a substrate by a holding unit;

rotating a rotated unit connected to the holding unit by a rotating unit provided on a peripheral outer side of the rotated unit; and physically cleaning the substrate being rotated by the rotating unit by a cleaning unit.

Advantageous Effects of Invention

In the present invention, the substrate is held by the holding unit, and the holding unit itself is rotated by rotating the rotated unit by the rotating unit. For this reason, a mechanism, such as a spindle, that generates rubbing with the substrate is not used, and dust is hardly generated. Accordingly, reverse contamination on the substrate can be reduced. Furthermore, according to the present invention, a mechanism of supporting a chuck as shown in FIG. 1 of Patent Literature 1 is not provided on the back surface (the second surface) side of the substrate. Accordingly, turbulence of an air current can also be reduced, and physical cleaning of the back surface (the second surface) side of the substrate can also be performed comparatively easily.

DESCRIPTION OF EMBODIMENTS

First Embodiment

<<Configuration>>

Hereinafter, a first embodiment of a substrate processing apparatus having an apparatus for cleaning a substrate according to the present invention will be described with reference to the drawings. In the present embodiment, a "front surface side of a substrate" means an upper side of FIG. 2, a "back-surface side of a substrate" means a lower side of FIG. 2, a normal direction of a substrate will be referred to as the "first direction", and an inner surface direction of a substrate W will be referred to as the "in-plane direction". The "front surface side of a substrate" will also be referred to as "one side", and the "back-surface side of a substrate" will also be referred to as "the other side".

Figure 1:
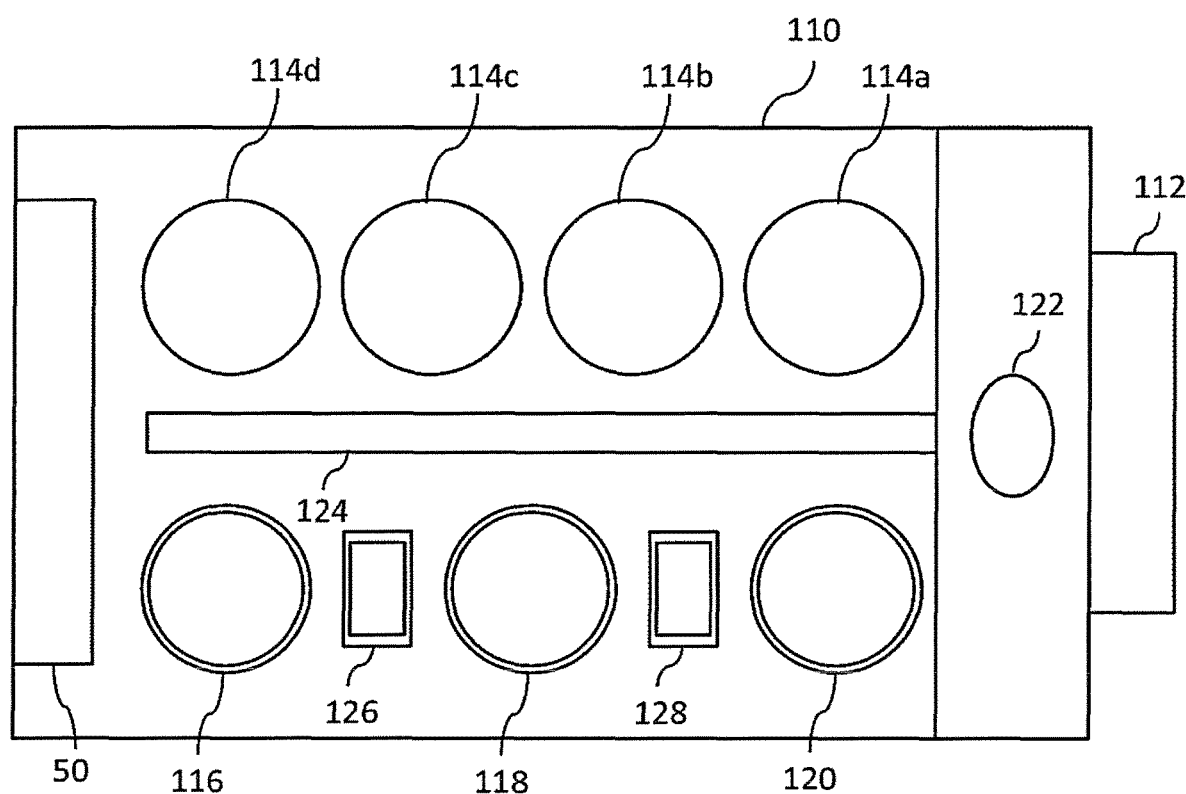
FIG. 1 is a top plan view showing an entire configuration of an apparatus for processing a substrate including an apparatus for cleaning the substrate according to a first embodiment of the present invention.

As shown in FIG. 1, the substrate processing apparatus has a roughly rectangular housing 110 and a load port 112; a substrate W cassette that stocks a number of substrates W is put on the load port 112. The load port 112 is placed adjacent to the housing 110. The load port 112 can be loaded with an open cassette, a SMIF (Standard Mechanical Interface) pod or a FOUP (Front Opening Unified Pod). A SMIF pod and a FOUP are hermetically sealed enclosure that stores therein a substrate cassette and covers it with a bulkhead, and whereby an environment independent of the external space can be maintained. The substrate W is, for example, a semiconductor wafer and the like.

Inside the housing 110, a plurality of (in an aspect shown in FIG. 1, four) polishing units 114a to 114d, first and second cleaning units 116 and 118 for cleaning a polished substrate W, and a drying unit 120 for drying the cleaned substrate W are contained. The polishing units 114a to 114d are arranged along a long side of the substrate processing apparatus, and the cleaning units 116 and 118 and the drying unit 120 are also arranged along the long side of the substrate processing apparatus. The substrate processing apparatus according to the present embodiment can polish various substrates W in a step of manufacturing a semiconductor wafer with a diameter of 300 mm or 450 mm, a flat panel, an image sensor such as complementary metal oxide semiconductor (CMOS) or charge coupled device (CCD), and a magnetic film in a magnetoresistive random access memory (MRAM).

In an area surrounded by the load port 112, and the polishing unit 114a and the drying unit 120 that are located on the side of the load port 112, a first transfer robot 122 is placed. Furthermore, a conveyance unit 124 is placed parallel to the polishing units 114a to 114d as well as the cleaning units 116 and 118 and the drying unit 120. The first transfer robot 122 receives a pre-polished substrate W from the load port 112 and transfers the substrate W to the conveyance unit 124, or receives a dried substrate W from the drying unit 120.

Figure 6:
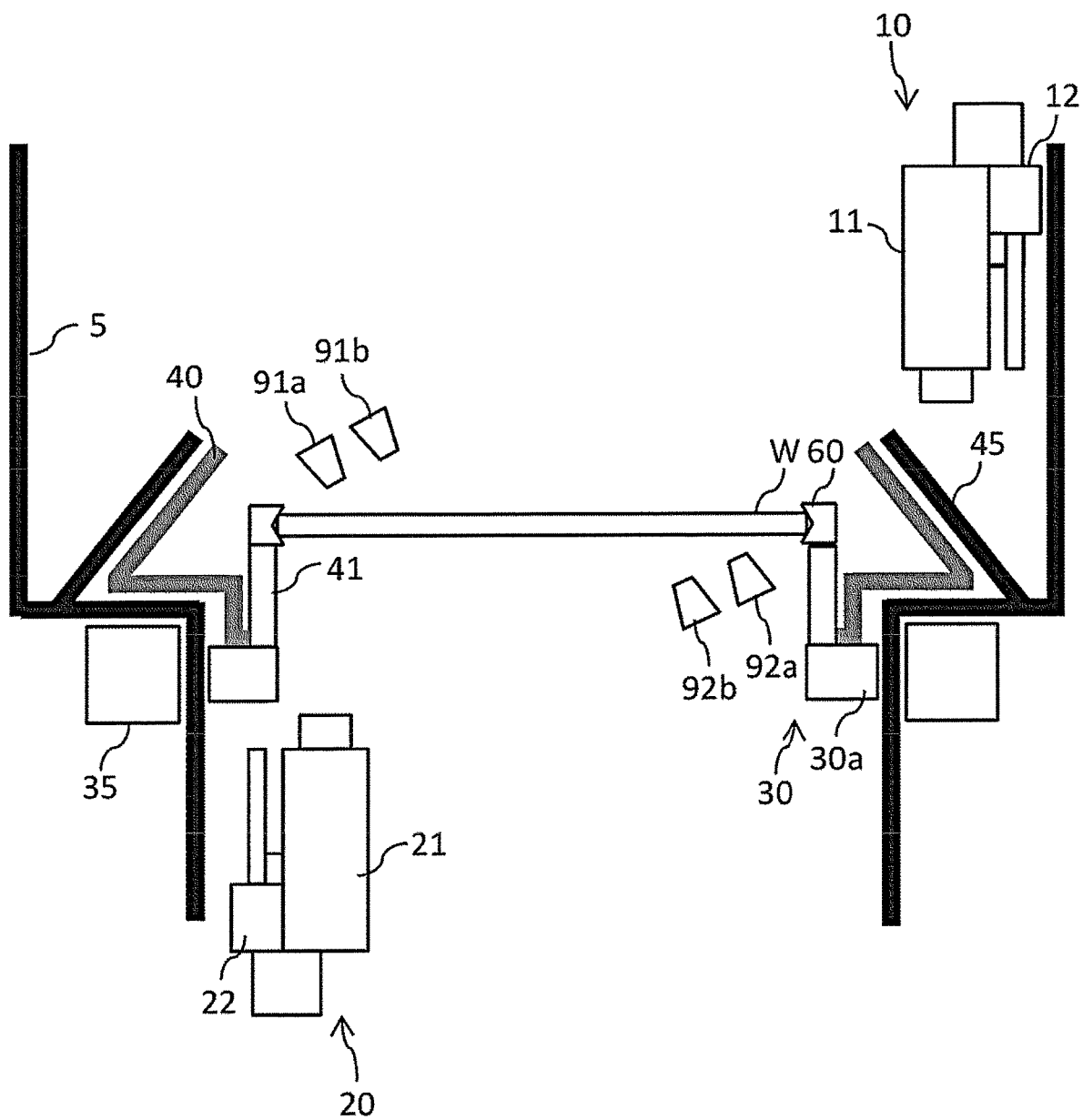
FIG. 6 is a side cross-sectional view when the apparatus for cleaning the substrate according to a variation of the first embodiment of the present invention is at a standby position.

A second transfer robot 126 for transferring a substrate W between the first cleaning unit 116 and the second cleaning unit 118 is placed between the first cleaning unit 116 and the second cleaning unit 118, and a third conveyance unit 128 for transferring the substrate W between the second cleaning unit 118 and the dying unit 120 is placed between the second cleaning unit 118 and the drying unit 120. Furthermore, inside the housing 110, an control unit 50 for controlling the operation of each device of the substrate processing apparatus is placed. In the present embodiment, there is described the aspect in which the control unit 50 is placed inside the housing 110; however, the placement of the control unit 50 is not limited to this, and the overall control unit 150 may be placed outside the housing 110, and may be remotely operated from a remote place. As shown in FIG. 6, an overall storage unit 160 for storing various items of information may be connected to the overall control unit 150. Furthermore, a control unit 50 may be configured with a plurality of devices. When the control unit 50 is configured with a plurality of devices, the devices constituting the control unit 50 may be installed in different rooms or different locations, and part of the control unit 50 and the remaining part of the control unit 50 may be arranged in remote locations.

A roll cleaning apparatus for scrubbing a surface of a substrate W while rotating around the center axis parallel with the substrate W by bringing the roll cleaning members linearly extending almost along the full diameter of the substrate W into contact with a cleaning liquid may be used for the first cleaning unit 116. A pencil cleaning apparatus for scrubbing a surface of a substrate by bringing the lower end contact faces of the vertically-extending columnar pencil cleaning members into contact with a cleaning liquid and moving the pencil cleaning members in one direction while rotating may be used for the second cleaning unit 118. A spin drying unit for drying a substrate W by injecting IPA steam from a moving injection nozzle toward the horizontally rotating substrate W and drying the substrate W by centrifugal force by faster rotating the substrate W may be used for the drying unit 120.

The first cleaning unit 116 may not use a roll cleaning apparatus, but may use a pencil cleaning apparatus similar to the second cleaning unit 118 or a two-fluid jet cleaning apparatus for cleaning a surface of a substrate W by two-fluid jet. Further, the second cleaning unit 118 may not use a pencil cleaning apparatus, but may use a roll cleaning apparatus similar to the first cleaning unit 116, or a two-fluid jet cleaning apparatus for cleaning a surface of a substrate W by two-fluid jet. An aspect of the present invention can also be applied to a first cleaning unit 116 and a second cleaning unit 118, and can also be used together with a roll cleaning device, a pencil cleaning device, and/or a two-fluid jet cleaning device. Aspects shown in FIGS. 2 to 6 are typical ones, and the aspect of the present invention is used for a pencil cleaning device and a two-fluid jet cleaning device.

The cleaning liquid in the present embodiment contains rinse liquid, such as deionized water (DIW), and chemical liquid, such as ammonia hydrogen peroxide (SC1), hydrochloric acid hydrogen peroxide (SC2), sulfuric acid hydrogen peroxide (SPM), sulfuric acid hydrolysate, or hydrofluoric acid. In the present embodiment, unless otherwise specified, cleaning liquid means either rinse liquid or chemical liquid.

Figure 2:
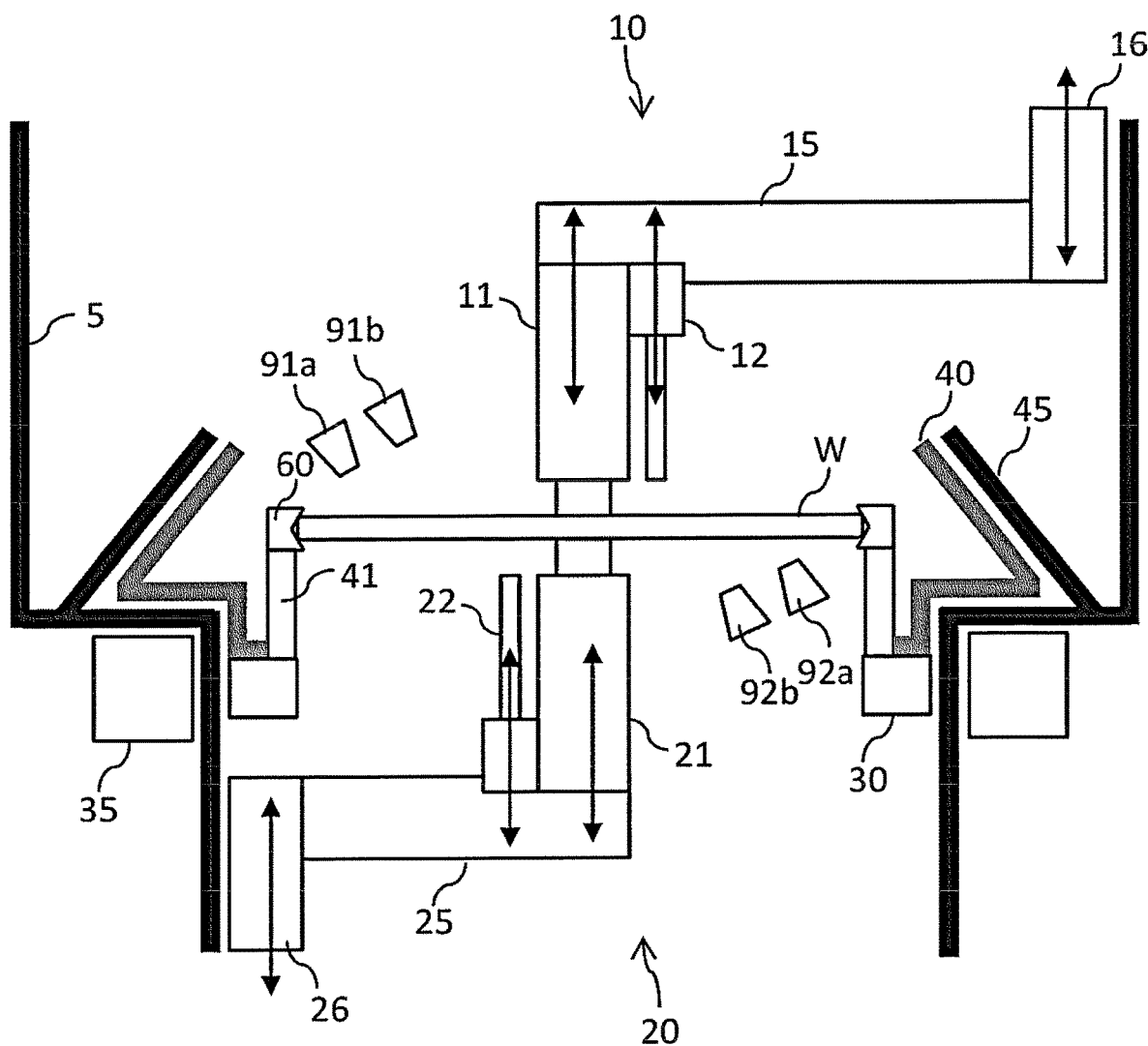
FIG. 2 is a side cross-sectional view when the apparatus for cleaning the substrate according to the first embodiment of the present invention is at a cleaning position.

As shown in FIG. 2, the apparatus for cleaning the substrate according to an embodiment of the present invention may have a housing 5, a holding unit 60 configured with a chuck that holds a substrate W and the like in the housing 5, a rotated unit 30 that is connected to the holding unit 60 and has a hollow shape, a rotating unit 35 having a hollow shape that is provided on a peripheral outer side of the rotated unit 30 and rotates the rotated unit 30, and cleaning units 10 and 20 that physically clean the substrate W held by the holding unit 60. In the aspect as shown in FIG. 2, the rotated unit 30 is provided in the inside of the housing 5, and the rotating unit 35 is provided outside the housing 5. However, the configuration is not limited to the above, and both the rotated unit 30 and the rotating unit 35 may be provided in the inside of the housing 5. The holding unit 60 is in an open or closed state when not holding the substrate W, and is in a closed state when holding the substrate W. Opening and closing of the holding unit 60 may be controlled based on an instruction from the control unit 50, or the holding unit 60 may automatically be in a closed state when the substrate W is placed, and may automatically be in an open state when the substrate W is removed (as a certain amount of force or larger is applied). A down flow of air flowing from above to below is formed in the housing 5.

In the aspect shown in FIG. 2, only two of the holding units 60 are shown. However, in the present embodiment, four of the holding units 60 may be arranged evenly (at angles of 90° with respect to a rotation center) when viewed from the top. Note that the number of the holding units 60 is large enough to enable stable holding of the substrate W, and may be, for example, three. Furthermore, an entire periphery of the substrate W may be held by the holding unit 60. FIG. 2 shows an example where the substrate W is held in a horizontal direction. However, the configuration is not limited to this example, and, for example, the substrate W may be configured to be held in a vertical direction (perpendicular direction) or may be configured to be held in a manner inclined to a horizontal direction.

The rotating unit 35 may rotate the rotated unit 30 in a non-contacting state with the rotated unit 30. As an example, with the rotating unit 35 as a stator and the rotated unit 30 as a rotor, the rotated unit 30 may be magnetically rotated in a non-contacting state. In this case, the rotated unit 30 may have a magnet, and the rotating unit 35 may have a coil or a coil and a magnet. Conversely, the rotated unit 30 may have a coil or a coil and a magnet, and the rotating unit 35 may have a magnet. The rotating unit 35 may be provided to enclose an entire periphery of the housing 5. Note that, when routing of a wire to a coil and the like is considered, the aspect in which the rotated unit 30 has a magnet and the rotating unit 35 has a coil or a coil and a magnet is more advantageous. The rotating unit 35 and the rotated unit 30 constitute what is called a bearing-less motor that can rotate the rotated unit 30 in a non-contacting manner and without pivotally supporting the rotated unit 30 with a bearing while a position in an in-plane direction is controlled. To reduce the size of the apparatus for cleaning the substrate, the bearing-less motor does not have another magnetic bearing for holding a rotor in space. This bearing-less motor can be one that is publicly-known. Note that also when rotation of the rotated unit 30 is stopped and holding and releasing operation of the substrate W are performed, a position in the first direction, a position in an in-plane direction, and a rotation phase of the rotated unit 30 can be maintained at predetermined positions and phase by a magnetic force.

As another example of the rotating unit 35 and the rotated unit 30, the rotating unit 35 and the rotated unit 30 may be configured with a combination of a motor, a radial magnetic bearing, and a thrust magnetic bearing as described in JP H4-94537 A.

Note that the rotating unit 35 may rotate the rotated unit 30 in a contacting state with the rotated unit 30. As an example, the configuration may be such that the rotated unit 30 and the rotating unit 35 have a gear, and are physically connected to each other with the gear, and rotation of the rotating unit 35 causes the rotated unit 30 to rotate.

The cleaning units 10 and 20 may have a first cleaning unit 10 that physically cleans a first surface (a top surface in FIG. 2) of the substrate W and a second cleaning unit 20 that physically cleans a second surface (a bottom surface in FIG. 2) on an opposite side of the first surface. In the present embodiment, the "first surface" is also referred to as "front surface", and the "second surface" is also referred to as "back surface".

A rotation cup 40 connected to the holding unit 60 may also be provided. Then, the rotated unit 30 may also be provided on the rotation cup 40. As an example, as shown in FIG. 2, the rotated unit 30 may also be provided on an end part on the other side of the rotation cup 40.

In a case where the aspect in which the rotated unit 30 has a magnet and the rotating unit 35 has a coil or a coil and a magnet, or the aspect in which the rotated unit 30 has a coil or a coil and a magnet and the rotating unit 35 has a magnet is employed, the rotation cup 40 and the rotated unit 30 are not in contact with any part of the housing 5, and rotated in a floating state. According to the aspect of the present embodiment, the substrate W can also be rotated at, for example, 400 to 1250 rpm, preferably 500 to 1000 rpm. Note that as the number of revolutions is too high, turbulence of an air current becomes violent, a spatter of a cleaning solution becomes large, and the substrate W is dried fast. For this reason, from the above viewpoint, the number of revolutions is preferably not larger than 1250 rpm, and is more preferably not larger than 1000 rpm. However, according to the aspect of the present embodiment, rotation can be performed at 3000 rpm.

When a rotation support unit, such as a spindle, is employed, rotation has been performed at the number of revolutions of 500 rpm at the maximum in order to prevent dust that is generated between the rotation support unit and the substrate W. In contrast, according to the present embodiment, the rotation can be preferably performed at 500 rpm or larger. Accordingly, cleaning ability can be improved as compared with the case where a rotation support unit, such as a spindle, is employed.

As shown in FIG. 2, a support pillar 41 that supports the holding unit 60 is provided on an inner side of the rotation cup 40, and the holding unit 60 may be provided on an end part on one side (an end part on the substrate W side along the normal direction of the substrate W) of the support pillar 41. Note that in the aspect shown in FIG. 2, an end part on one side of the rotation cup 40 is positioned farther than an end part on one side of the holding unit 60 from the substrate W. Furthermore, employing the aspect in which the rotated unit 30 is provided on an end part on the other side of the rotation cup 40 (an end part on the opposite side of the substrate W along the normal direction of the substrate W) and the holding unit 60 is provided on an end part on one side (an end part on the substrate W side along the normal direction of the substrate W) of the support pillar 41 extending from the rotated unit 30 is advantageous with respect to the point that the rotation cup 40 can be positioned on a peripheral outer side of the substrate W while the rotated unit 30 is cooled by a cleaning solution in a more ensured manner.

A fixing cup 45 may also be provided on a peripheral outer side of the rotation cup 40. Employing the above fixing cup 45 is advantageous with respect to the point that turbulence of an air current generated by the rotation cup 40 can be restricted.

The rotation cup 40 may also be provided with one or a plurality of discharge units (not shown) used for discharging a cleaning solution received by the rotation cup 40. A cleaning solution discharged from the discharge unit may be guided to a drain and applied with solution discharging processing. When a plurality of discharge units are provided, the discharge units may be provided evenly in a circumferential direction. Furthermore, as shown in FIG. 2, a gap is provided between the fixing cup 45 and the rotation cup 40, and a cleaning solution received by the fixing cup 45 may be guided to a drain by flowing on an inner wall of the fixing cup 45 and applied with solution discharging processing.

The cleaning units 10 and 20 may physically clean the substrate W with 0.3 N or larger and 3 N or lower. The "physical cleaning" in the present embodiment means cleaning that applies a force of a threshold value or larger (for example, 0.3 N or larger), and includes cleaning using a fluid, such as two-fluid jet cleaning, as long as a force of the threshold value or larger is applied. When a force that exceeds 3 N is applied, a case where, for example, a sponge member is pressed against the substrate W and waste is trapped, can be expected. Alternatively, it is also expected that a jet flow from a two-fluid jet may damage the substrate W. As a matter of course, in some cases, there may be a possibility that a force that significantly exceeds 3 N (for example, a force that exceeds 10 N) is accidentally applied to a position significantly away from the center of gravity of the substrate W, which causes the substrate W to float, and the rotating substrate W or the rotation cup 40 is inclined. For this reason, in a case where the aspect in which the rotated unit 30 has a magnet and the rotating unit 35 has a coil or a coil and a magnet, or the aspect in which the rotated unit 30 has a coil or a coil and a magnet and the rotating unit 35 has a magnet is employed, a force used for physical cleaning is preferably 3 N or smaller. Furthermore, when the force is smaller than 0.3 N, a cleaning force with respect to the substrate W is impaired. For this reason, the force at the time of physical cleaning is preferably 0.3 N or larger.

As shown in FIG. 2, the first cleaning unit 10 may have a first arm 15 that swings around a first swinging shaft 16, and first cleaning units 11 and 12 that are provided on a front-end side of the first arm 15 and extend toward the substrate W side. In the aspect shown in FIG. 2, the first cleaning units 11 and 12 have a first fluid jet cleaning unit 12 and a first pencil cleaning unit 11. For example, an actuator or the like is provided as a first moving unit (not shown). The first moving unit may cause the first fluid jet cleaning unit 12 and the first pencil cleaning unit 11 to approach the first surface of the substrate W or to be separated in a direction of moving away from the first surface. Furthermore, the first arm 15 itself may be caused to approach the first surface of the substrate W or to be separated in a direction of moving away from the first surface. Note that the fluid jet cleaning unit has a two-fluid jet nozzle that jets a mixed fluid of liquid and liquid at high speed.

As shown in FIG. 2, the second cleaning unit 20 may have a second arm 25 that swings around a second swinging shaft 26, and second cleaning units 21 and 22 that are provided on a front-end side of the second arm 25 and extend toward the substrate W side. In the aspect shown in FIG. 2, the second cleaning units 21 and 22 have a second fluid jet cleaning unit 22 and a second pencil cleaning unit 21. For example, a second moving unit (not shown) is configured with an actuator or the like. The second moving unit may cause the second fluid jet cleaning unit 22 and the second pencil cleaning unit 21 to approach the second surface of the substrate W or to be separated in a direction of moving away from the second surface. Furthermore, the second arm 25 itself may be caused to approach the second surface of the substrate W or to be separated in a direction of moving away from the second surface.

Furthermore, a first chemical solution supply nozzle 91*a* that supplies a chemical solution and a first rinse solution supply nozzle 91*b* that supplies a rinse solution to the first surface may be provided. Similarly, a second chemical solution supply nozzle 92*a* that supplies a chemical solution and a second rinse solution supply nozzle 92*b* that supplies a rinse solution to the second surface may be provided.

The configuration may be such that the first pencil cleaning unit 11 is provided rotatably in a front-end part of the first arm 15, and rotated (rotates) by using its center axis as a rotation axis by a drive mechanism (not shown). For example, this rotation axis is an axis along the normal direction of the substrate W. A front end of the first pencil cleaning unit 11 may be constituted by, for example, PVA sponge. When the first arm 15 swings around the first swinging shaft 16, the first pencil cleaning unit 11 attached to a front-end part of the first arm 15 moves above the substrate W in an arc-like locus. The first pencil cleaning unit 11 may pass through the center of the substrate W. Furthermore, the first pencil cleaning unit 11 may be moved to an outer periphery of the substrate W. A moving locus of the first pencil cleaning unit 11 created by swinging of the first arm 15 has an arc shape having a length of the first arm 15 as a radius, and its moving range may be from an outer periphery of the substrate W to somewhere beyond the center of the substrate W.

Similarly, the configuration may be such that the second pencil cleaning unit 21 is provided rotatably in a front-end part of the second arm 25, and rotated (rotates) by using its center axis as a rotation axis by a drive mechanism (not shown). For example, this rotation axis is an axis along the normal direction of the substrate W. The second pencil cleaning unit 21 may be constituted by, for example, PVA. When the second arm 25 swings around the second swinging shaft 26, the second pencil cleaning unit 21 attached to a front-end part of the second arm 25 moves above the substrate W in an arc-like locus. The second pencil cleaning unit 21 may pass through the center of the substrate W. Furthermore, the second pencil cleaning unit 21 may be moved to an outer periphery of the substrate W. A moving locus of the second pencil cleaning unit 21 created by swinging of the second arm 25 has an arc shape having a length of the second arm 25 as a radius, and its moving range may be from an outer periphery of the substrate W to somewhere beyond the center of the substrate W.

The first fluid jet cleaning unit 12 and the second fluid jet cleaning unit 22 are used for cleaning the substrate W by two fluids obtained by mixing liquid and gas.

Figure 3:
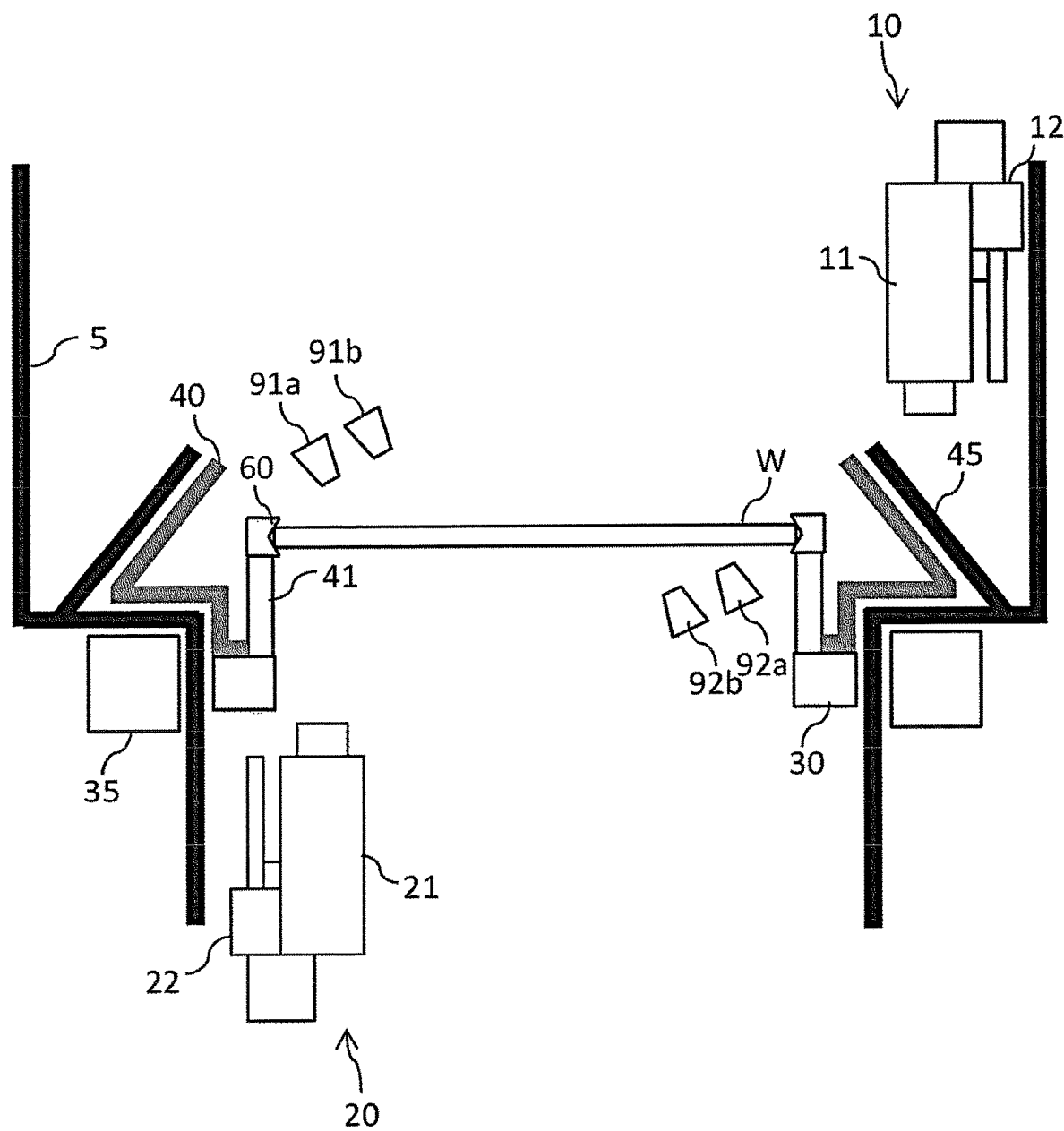
FIG. 3 is a side cross-sectional view when the apparatus for cleaning the substrate according to the first embodiment of the present invention is at a standby position.

As shown in FIG. 3, the configuration may be such that the first cleaning unit 10 is not positioned above the substrate W at the time of standby. By employing the above aspect, a cleaning solution from the first cleaning unit 10 can be prevented from dripping on the substrate W at the time of standby. The first cleaning unit 10 is configured not to be positioned in the normal direction (in an upward direction in FIG. 3) of the substrate W at the time of standby, so that the first cleaning unit 10 can be prevented from becoming an obstacle when the substrate W is carried into the housing 5. Furthermore, the first cleaning unit 10 may be positioned at a position away from the substrate W relative to a front end (an upper end in FIG. 3) of the fixing cup 45 in the normal direction of the substrate W and on a peripheral outer side of a front end of the fixing cup 45. By positioning the first cleaning unit 10 at this position, it can be ensured that the first cleaning unit 10 is prevented from becoming an obstacle when the substrate W is carried into the housing 5.

As shown in FIG. 3, the second cleaning unit 20 may be positioned at a position away from the substrate W relative to the rotated unit 30 (a position below the rotated unit 30 in FIG. 3) in the normal direction of the substrate W (downward direction in FIG. 3) at the time of standby. By positioning the second cleaning unit 20 at this position, it can be more ensured that the second cleaning unit 20 is prevented from becoming an obstacle when the substrate W is carried into the housing 5. Note that the second cleaning unit 20 does not become an obstacle when the substrate W is carried into the housing 5. In such a case, the second cleaning unit 20 does not need to be positioned at the standby position as shown in FIG. 3.

<<Method>>

An example of a method of cleaning the substrate W (a substrate processing method) using the apparatus for cleaning the substrate according to the present embodiment is as described below. Only a simple description will be made since the example is a duplicate of the above configuration. All the aspects described in the above "configuration" can be applied to the "method". Conversely, all the aspect described in the "method" can be applied to the "configuration". A program for performing the method of the present embodiment may be recorded in a recording medium, and the method of the present embodiment may be performed by the apparatus for processing the substrate by causing a computer (not shown) to read the recording medium.

First, the substrate W carried into the housing 5 by a conveying unit 124 or a second conveying robot 126 is held by the holding unit 60, such as a chuck. At this time, the first cleaning unit 10 and the second cleaning unit 20 are positioned at a standby position shown in FIG. 3.

Next, the rotated unit 30 is rotated by the rotating unit 35, and, as a result, the substrate W held by the holding unit 60 is rotated integrally with the rotation cup 40. When the substrate W is held by the holding unit 60 in the above manner, aspects of the second and subsequent embodiments described later may be employed.

While the substrate W is rotated, a chemical solution is supplied from the first chemical solution supply nozzle 91a to the first surface of the substrate W, and a chemical solution is supplied from the second chemical solution supply nozzle 92a to the second surface of the substrate W. While the chemical solution is supplied as described above, the first pencil cleaning unit 11 physically cleans the first surface of the substrate W, and the second pencil cleaning unit 21 physically cleans the second surface of the substrate W. More specifically, the first arm 15 swings around the first swinging shaft 16, and the first pencil cleaning unit 11 passes through the center of the substrate W and is moved to an outer periphery of the substrate W. Similarly, the second arm 25 swings around the second swinging shaft 26, and the second pencil cleaning unit 21 passes through the center of the substrate W and is moved to an outer periphery of the substrate W. During the above, the first pencil cleaning unit 11 and the second pencil cleaning unit 21 may be rotated while being pressed against the substrate W with 0.3 N or larger and 3 N or smaller (for example, 2 N).

When the cleaning by the first pencil cleaning unit 11 and the second pencil cleaning unit 21 is finished, the first pencil cleaning unit 11 and the second pencil cleaning unit 21 are separated from the substrate W. Then, at the same time as or immediately before supply of the chemical solution is stopped, the first fluid jet cleaning unit 12 and the second fluid jet cleaning unit 22 are positioned at a position close to the substrate W, and the first fluid jet cleaning unit 12 jets two fluids to the first surface of the substrate W and the second fluid jet cleaning unit 22 jets two fluids to the second surface of the substrate W. Note that the two fluids preferably jet to the substrate W at the same time as or before supply of the chemical solution is stopped. Note that the two fluid nozzle can be an external mixing nozzle that forms a droplet of liquid by mixing liquid and air outside a casing of the two fluid nozzle. Alternatively, in place of the above, an internal mixing nozzle that forms a droplet of liquid by mixing liquid and gas in the inside of the nozzle can be used as the two fluid nozzle.

While two fluids are caused to jet as described above, the first arm 15 swings around the first swinging shaft 16, and the first fluid jet cleaning unit 12 passes through the center of the substrate W and is moved to an outer periphery of the substrate W. Similarly, the second arm 25 is caused to swing around the second swinging shaft 26, and the second fluid jet cleaning unit 22 passes through the center of the substrate W and is moved to an outer periphery of the substrate W. Even when the above cleaning using two fluids is performed, a certain pressure acts on the substrate W. This pressure may be 0.3 N or larger and 3 N or smaller, and is 1.5 N as an example.

At the same time as or immediately before two-fluid jet cleaning is stopped, a chemical solution is supplied from the first chemical solution supply nozzle 91a to the first surface of the substrate W, and a chemical solution is supplied from the second chemical solution supply nozzle 92a to the second surface of the substrate W. While the chemical solution is supplied as described above, the first cleaning unit 10 and the second cleaning unit 20 are positioned at a standby position shown in FIG. 3.

Next, a rinse solution is supplied from the first rinse solution supply nozzle 91b to the first surface of the substrate W, and a rinse solution is supplied from the second rinse solution supply nozzle 92b to the second surface of the substrate W. After a time period in which the rinse solution reaches the substrate W or a sufficient time period elapses, the supply of the chemical solution from the first chemical solution supply nozzle 91a and the second chemical solution supply nozzle 92a is stopped. To determine whether a time period in which the rinse solution reaches the substrate W has elapsed, a time period measured in advance may be used. In this case, for example, the control unit 50 may read a recipe stored in a storage unit (not shown) so that the supply of the chemical solution may be stopped at a scheduled timing.

After the first surface and the second surface of the substrate W are cleaned with the rinse solution for a predetermined time period, rotation of the substrate W is stopped. More specifically, rotation of the rotated unit 30 by the rotating unit 35 is stopped, and, as a result, rotation of the substrate W held by the holding unit 60 is stopped integrally with the rotation cup 40.

The substrate W in a wet state is taken out from the housing 5 by the second conveying robot 126 or a third conveying robot 128. When the substrate W is taken out as described above, aspects of the second and subsequent embodiments described later may be employed to remove the substrate W from the holding unit 60.

When cleaning of the substrate W is performed by the second cleaning unit 118 as finish cleaning, the substrate W may be taken out from the housing 5 by the third conveying robot 128 and carried into a drying unit 120. Then, when the substrate W is carried into the drying unit 120 as described above, the substrate W is dried by the drying unit 120.

Note that after the cleaning by rinsing, the substrate W may be dried by removing the rinse solution in a manner that the substrate W held by the holding unit 60 is rotated at high speed after the supply of the rinse solution from the first rinse solution supply nozzle 91b and the second rinse solution supply nozzle 92b is stopped. In the present embodiment, the substrate W can be dried in the above manner since the substrate W can be rotated at the number of revolutions up to, for example, 3000 rpm. Employing this aspect is advantageous with respect to the point that processes from finish cleaning to drying can be performed in one unit.

As described above, it is advantageous to clean both the first surface and the second surface of the substrate W at the same time with a chemical solution by using the pencil cleaning units 11 and 21 and by two-fluid jet cleaning with respect to the point that the substrate W can be cleaned within a short period of time as compared with the aspect where only one of the first surface and the second surface is cleaned and reversed.

<<Function and Effect>>

Next, functions and effects of the present embodiment having the above configuration will be described mainly on those which have not been described yet. Note that an aspect described in "function and effect" can also be applied to the above "configuration".

In the present embodiment, the substrate W is held by the holding unit 60, and the holding unit 60 itself is rotated by rotating the rotated unit 30 by the rotating unit 35. For this reason, a mechanism, such as a spindle, that generates rubbing with the substrate W is not used, and dust is hardly generated. Accordingly, reverse contamination on the substrate W can be reduced. Furthermore, according to the present embodiment, a mechanism of supporting a chuck as shown in FIG. 1 of Patent Literature 1 is not provided on the back surface (the second surface) side of the substrate W. Accordingly, turbulence of an air current can also be reduced, and physical cleaning of the back surface (the second surface) side of the substrate W can also be performed comparatively easily.

In particular, in a case where the aspect in which the rotating unit 35 has a hollow shape is employed as shown in FIGS. 2 to 6, the second cleaning units 21 and 22 can make an access from the second surface side without any problem. For this reason, physical cleaning can be performed more easily also for the second surface. Furthermore, in a case where the aspect in which the rotating unit 35 has a hollow shape is employed, no member is provided in a center part of a rotating member (a member functioning as a blade is not provided). For this reason, it is more ensured that turbulence of an air current and generation of a negative pressure can be prevented. Note that when an air current is disturbed or a negative pressure is generated, there is possibility that a cleaning solution in the atmosphere returns to be attached to the substrate W, and finally becomes a stain. With respect to this point, by employing the aspect in which the rotating unit 35 has a hollow shape, the above problem can be prevented from occurring.

Furthermore, according to the present embodiment, both the first surface and the second surface of the substrate W can be easily cleaned at the same time. Accordingly, the present embodiment is advantageous with respect to the point that the substrate W can be cleaned within a short period of time as compared with the aspect where only one of the first surface and the second surface is cleaned and reversed. Furthermore, a large device configuration is required for reversing the substrate W. With respect to this point, according to the present embodiment, a device configuration can be prevented from becoming large as much as possible.

Furthermore, in a case where the aspect in which the rotated unit 30 has a magnet and the rotating unit 35 has a coil or a coil and a magnet, or the aspect in which the rotated unit 30 has a coil or a coil and a magnet and the rotating unit 35 has a magnet is employed, a certain degree of heat may be generated from the rotated unit 30 and the rotating unit 35. However, by employing the aspect where the rotated unit 30 is cooled with a cleaning solution as shown in FIGS. 2 to 6, the possibility that a problem occurs due to heat generated by the rotated unit 30 can be eliminated. In a case where the rotating unit 35 is provided in an inner side of the housing 5, the rotating unit 35 can be cooled with a cleaning solution. In contrast, when the rotating unit 35 is provided on an outer side of the housing 5, the rotating unit 35 can be cooled by air cooling. In a case where the rotating unit 35 is provided on an outer side of the housing 5, the rotating unit 35 may be attached to a base member of metal or the like (for example, aluminum-based member), or a heat radiation jacket or a water-cooling jacket so that the rotating unit 35 is cooled.

Employing the aspect in which the rotating unit 35 rotates the rotated unit 30 in a non-contacting state with the rotated unit 30 is advantageous with respect to the point that generation of dust from the rotating unit 35 and the rotated unit 30 can be prevented. That is, in the aspect where the rotated unit 30 and the rotating unit 35 have a gear, and are physically connected to each other with the gear, and the rotated unit 30 is rotated by rotation of the rotating unit 35, dust may be generated due to grease applied to the gear, and the like. With respect to this point, according to the above aspect, generation of such dust can be prevented.

Note that in a case where the aspect in which the rotated unit 30 has a magnet and the rotating unit 35 has a coil and a magnet, or the aspect in which the rotated unit 30 has a coil and a magnet and the rotating unit 35 has a magnet is employed, a magnet of the rotating unit 35 and a magnet as the rotated unit 30 attract each other when no current is supplied to the coil, and the rotation cup 40 is made in contact with an inner surface of the housing 5. In general, the rotation cup 40 and the housing 5 are preferably not in contact with each other. Accordingly, as shown in FIG. 6, an aspect in which a magnet as the rotated unit 30 has a projection unit 30a that projects to a peripheral outer side relative to the rotation cup 40 may be employed. By providing the projection unit 30a described above, the projection unit 30a is in contact with the housing 5, and the rotation cup 40 can be prevented from being in contact with the housing 5. The projection unit 30a may be provided over the entire periphery, may be provided intermittently, or may be provided in several locations (for example, four to twelve locations) evenly.

According to the present embodiment, dust is hardly generated, which is suitable for finish cleaning. As an example, the configuration may be such that the first surface and the second surface of the substrate W are cleaned in a comparatively rough manner by a roll cleaning member employed by the first cleaning unit 116, and the first surface and the second surface are applied with finish cleaning by the pencil cleaning units 11 and 21 and the fluid jet cleaning units 12 and 22 of the second cleaning unit 118. Note that a stain caused by a cleaning unit is attached less by the fluid jet cleaning units 12 and 22 than by the pencil cleaning units 11 and 21. Accordingly, it is more advantageous to perform cleaning by the fluid jet cleaning units 12 and 22 after performing cleaning by the pencil cleaning units 11 and 21.

Note that cleaning with high degree of cleanliness has not conventionally been performed for the second surface, since high degree of cleanliness has not been requested for the second surface which is a back surface, and has required a large device configuration and a long period of time. With respect to the above points, the present embodiment, in which the above disadvantages do not exist, is advantageous with respect to the point that high degree of cleanliness can be easily achieved for the second surface which is a back surface.

When the rotation cup 40 is employed, a cleaning solution and the like that scatter from the substrate W can be prevented from splashing on the substrate W again. That is, in an aspect in which the rotation cup 40 does not exist and only the fixing cup 45 exists, a cleaning solution and the like that scatter from the substrate W may splash on the substrate W again. However, by employing the rotation cup 40, such a problem can be prevented from occurring.

In particular, in a case where an aspect in which the rotated unit 30 connected to the holding unit 60 is provided on the rotation cup 40 is employed, the substrate W and the rotation cup 40 can be rotated at the same number of revolutions. For this reason, it can be more ensured that a cleaning solution and the like that scatter from the substrate W is prevented from splashing on the substrate W again. Note that when the rotation cup 40 is employed, a weight is increased. Accordingly, a normal person skilled in the art would not consider to employ the aspect in which the rotated unit 30 is rotated in a state where the rotating unit 35 is not in contact with the rotated unit 30. With respect to this point, the present embodiment shows that the above aspect is employed as a result of aiming at minimizing an influence on the substrate W by placing priority on generation of dust from the rotating unit 35 and the rotated unit 30.

Figure 4:
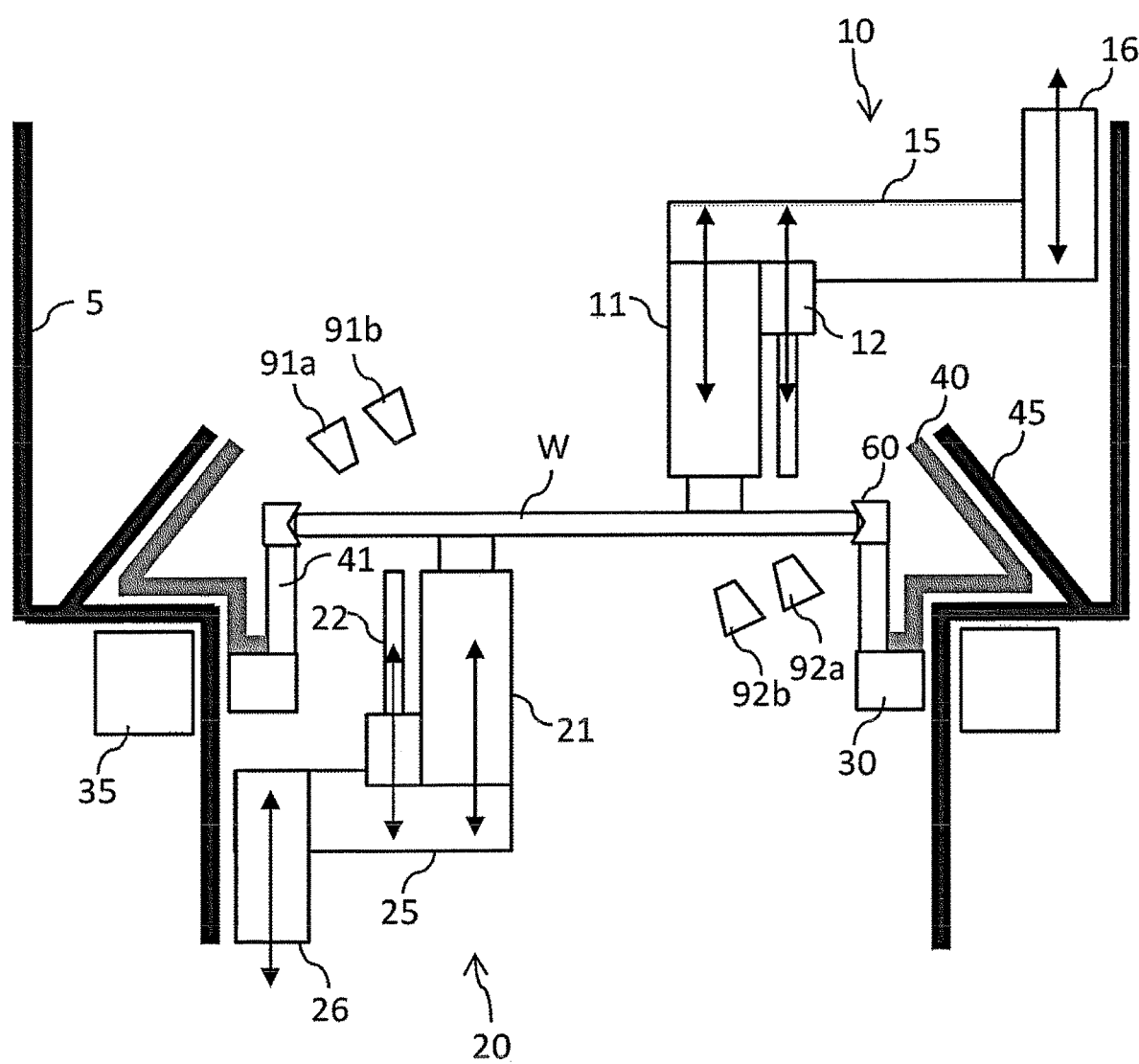
FIG. 4 is a side cross-sectional view when the apparatus for cleaning the substrate according to a first aspect that may be employed in the first embodiment of the present invention is at a cleaning position.

The control unit 50 may control a location applied with a force by the first cleaning units 11 and 12 and a location applied with a force by the second cleaning units 21 and 22 to be point symmetric on a plan view (refer to FIG. 4). By employing the above aspect, a force applied from the first surface side of the substrate W and a force applied from the second surface side can be made point symmetric, and can be expected to cancel each other in good balance. Accordingly, a force applied by the first cleaning units 11 and 12 and the second cleaning units 21 and 22 can be prevented from interfering with rotation of the substrate W. In particular, in a case where the aspect in which the rotated unit 30 has a magnet and the rotating unit 35 has a coil or a coil and a magnet, or the aspect in which the rotated unit 30 has a coil or a coil and a magnet and the rotating unit 35 has a magnet is employed, the substrate W rotates in a floating manner. Accordingly, employing the above aspect is advantageous in order to prevent inclination of the substrate W. Note that when the above aspect is employed, it is advantageous to make a force applied by the first cleaning units 11 and 12 and a force applied by the second cleaning units 21 and 22, which are applied at the same timing, the same or substantially the same from the viewpoint of cancelling the forces. Note that "substantially the same" means that a difference between the forces is within 5% of an average of both of the forces, and that when the force applied by the first cleaning units 11 and 12 is F1, the force applied by the second cleaning units 21 and 22 is F2, and an average value of F1 and F2 is Fa, $0.95 \times Fa \leq F1, F2 \leq 1.05 \times Fa$ is established.

Figure 5:
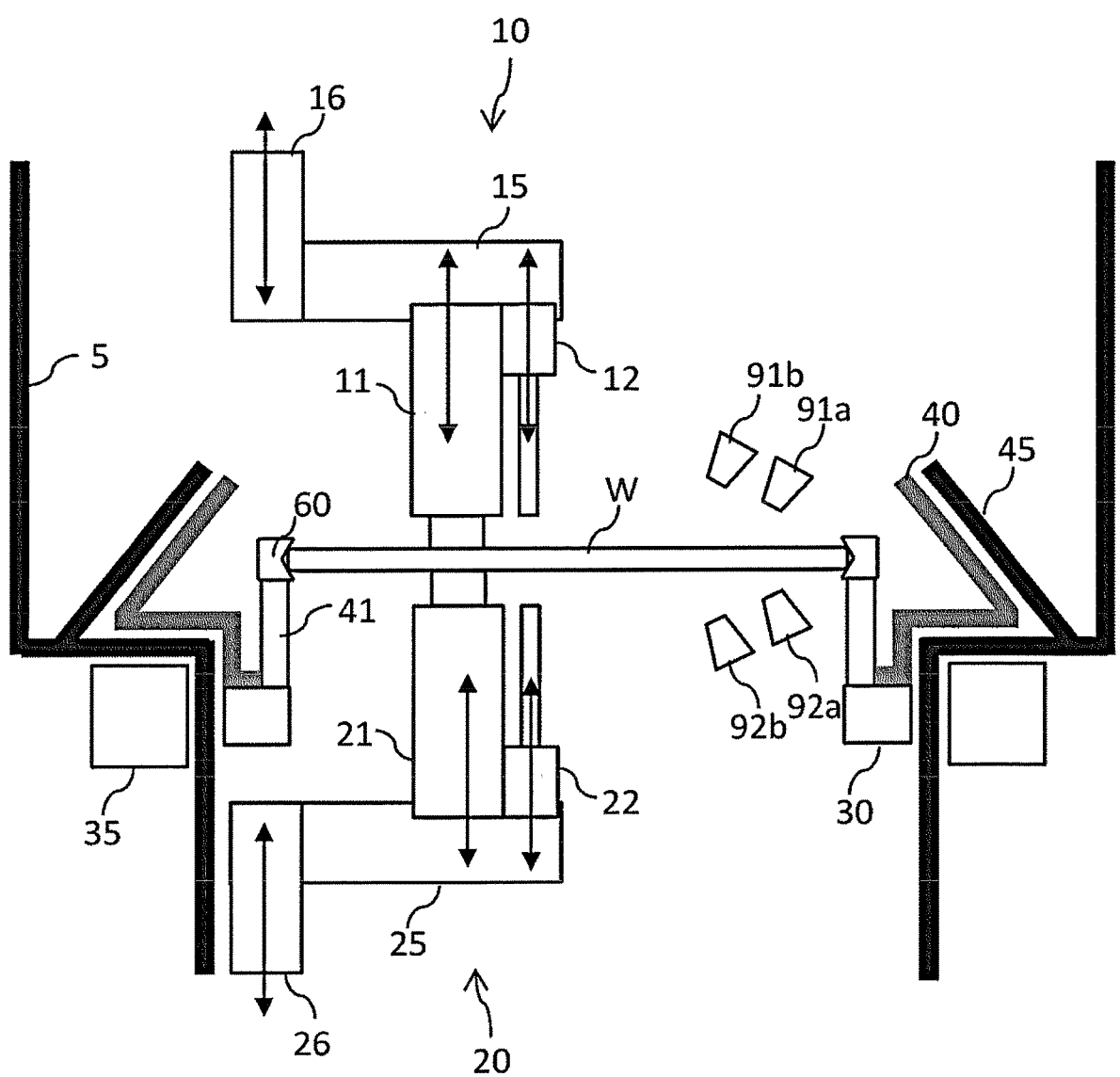
FIG. 5 is a side cross-sectional view when the apparatus for cleaning the substrate according to a second aspect that may be employed in the first embodiment of the present invention is at a cleaning position.

The control unit 50 may also control a location applied with a force by the first cleaning units 11 and 12 and a location applied with a force by the second cleaning units 21 and 22 to be the same on a plan view (refer to FIG. 5). By employing the above aspect, it can be more ensured that a force applied from the first surface side of the substrate W and a force applied from the second surface side cancel each other. Accordingly, a force applied by the first cleaning units 11 and 12 and the second cleaning units 21 and 22 can be prevented from interfering with rotation of the substrate W. In particular, in a case where the aspect in which the rotated unit 30 has a magnet and the rotating unit 35 has a coil or a coil and a magnet, or the aspect in which the rotated unit 30 has a coil or a coil and a magnet and the rotating unit 35 has a magnet is employed, the substrate W rotates in a floating manner. Accordingly, employing the above aspect is advantageous with respect to the point that inclination of the substrate W can be more ensured to be prevented. Note that when the above aspect is employed, it is advantageous to make a force applied by the first cleaning units 11 and 12 and a force applied by the second cleaning units 21 and 22, which are applied at the same timing, the same or substantially the same from the viewpoint of cancelling the forces.

Second Embodiment

Next, the second embodiment of the present invention will be described.

Figure 7:
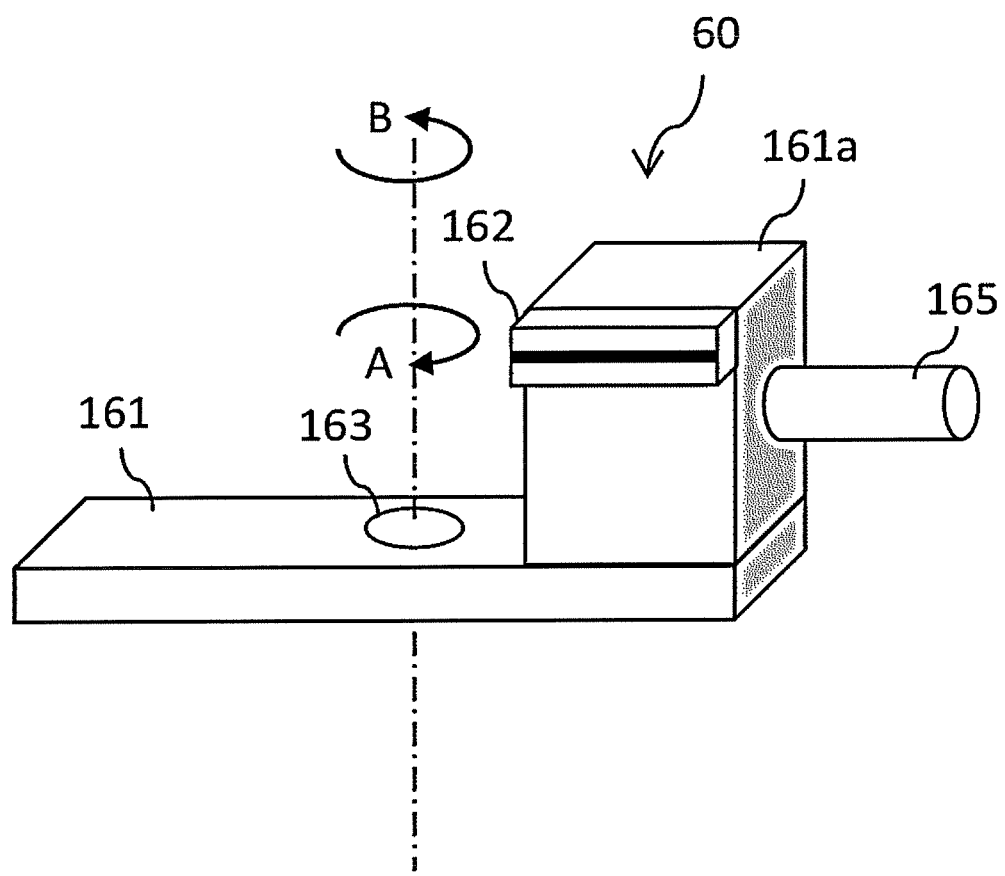
FIG. 7 is a perspective view of a holding unit that may be used in a second embodiment of the present invention.

As shown in FIG. 7, the present embodiment shows an aspect in which the holding unit 60 has a holding member 162 that holds the substrate W and an elastic member 169 (refer to FIG. 9) that provides a biasing force to the holding member 162. There is also provided an opening device 170 (refer to FIG. 8) that makes the holding member 162 in an open state by providing a force opposite to a biasing force applied by the elastic member 169. Note that the opening device 170 may be controlled by the control unit 50. This case is advantageous with respect to a point that holding of the substrate W by the holding unit 60 and removal of the substrate W held by the holding unit 60 can be performed automatically. The other configurations are similar to those of the first embodiment. In the present embodiment, all the aspects described in the first embodiment can be employed. The members described in the first embodiment will be described by using the same reference signs.

Figure 13:
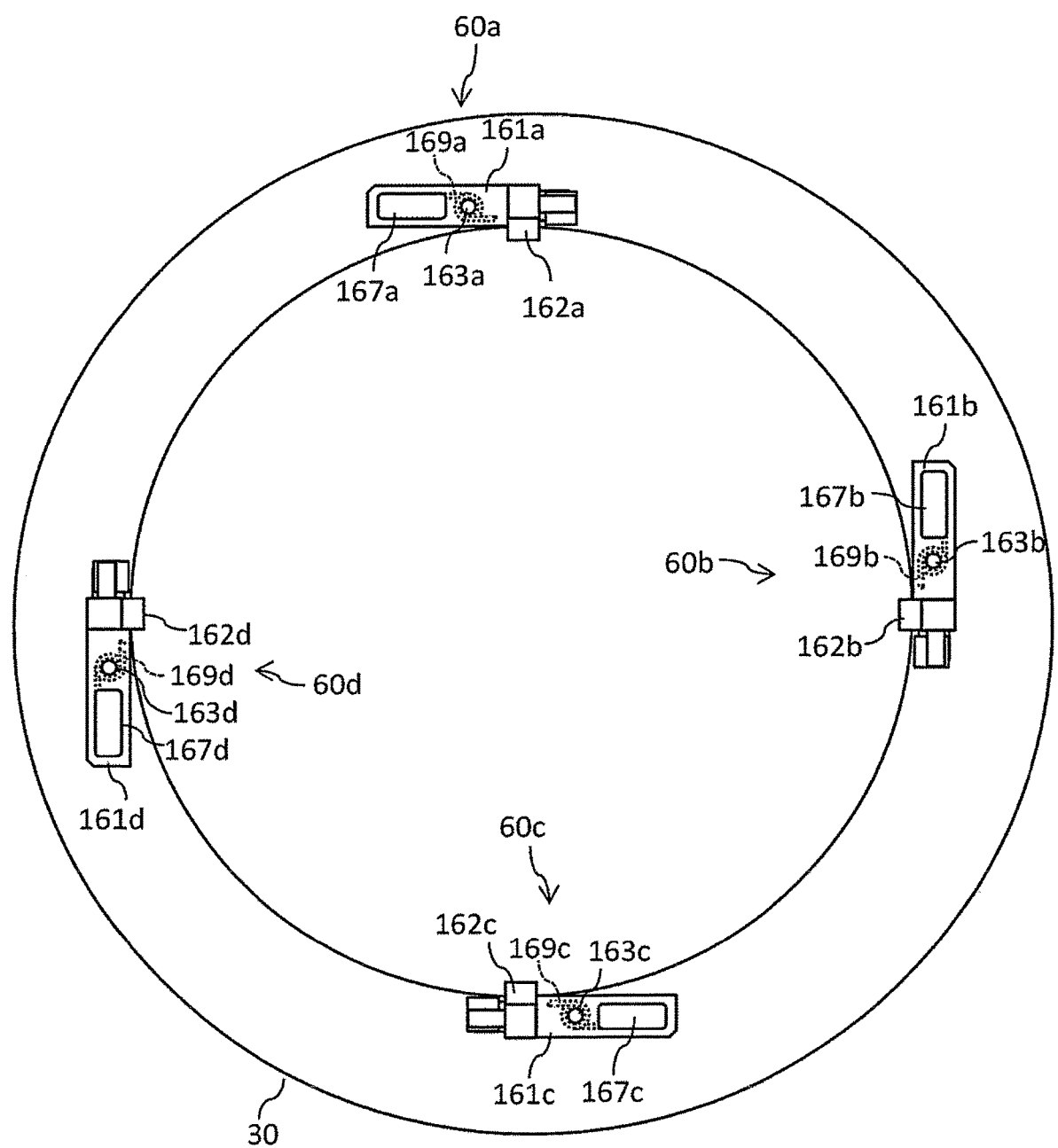
FIG. 13 is a plan view showing a plurality of holding units provided in a rotated unit that may be used in the second embodiment of the present invention.

In the present embodiment, an aspect in which four of the holding units 60 (60a to 60d) are provided as shown in FIG. 13 will be described as an example. This aspect is mere an example, and the number of the holding units 60 provided may be two, three, five, or more.

Figure 14:
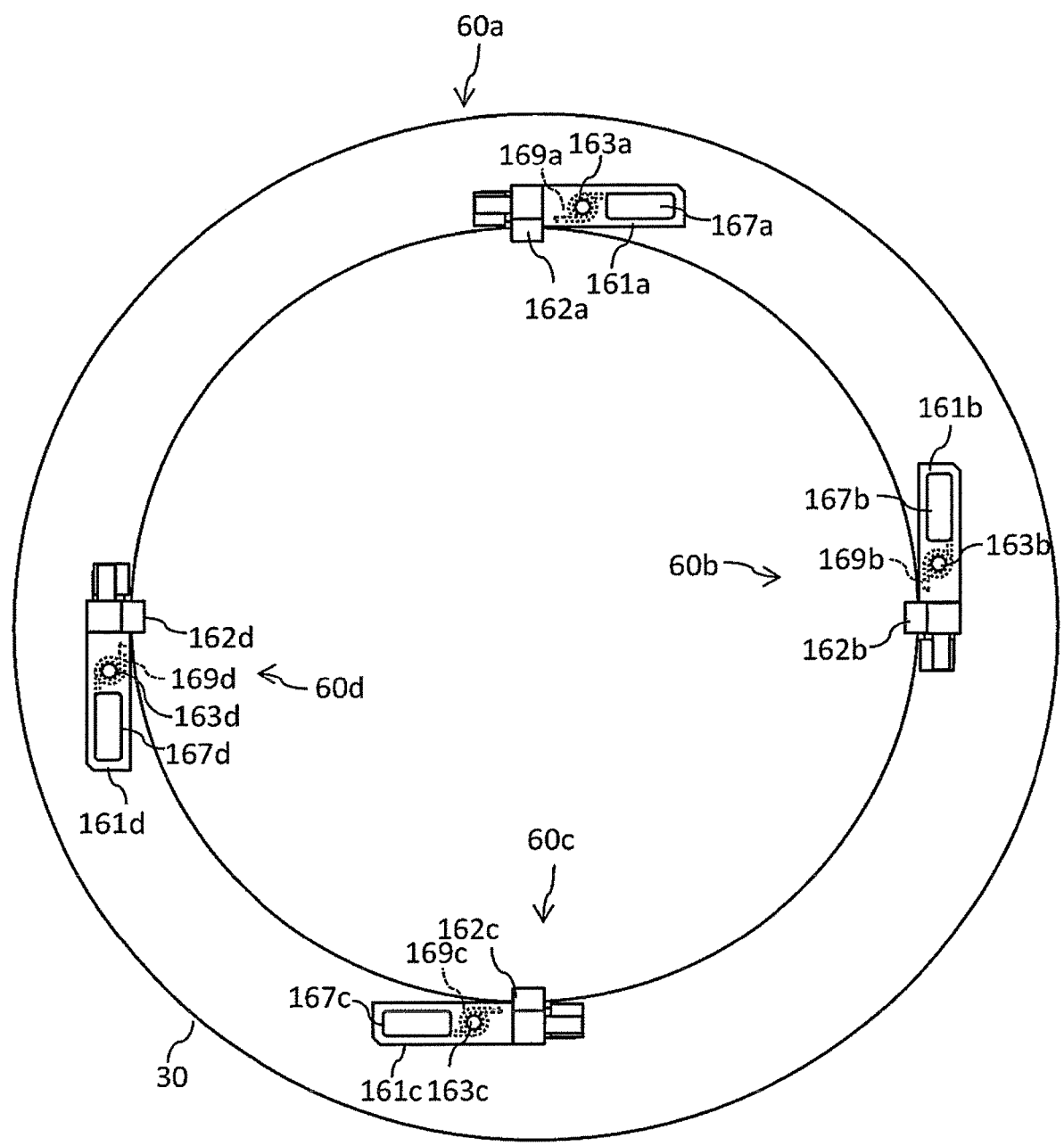
FIG. 14 is a plan view showing another example of a plurality of holding units provided in the rotated unit that may be used in the second embodiment of the present invention.

The opening device 170 may make the holding member 162 in an opening state by abutting on the holding member 162 on the front surface side of the substrate W. The configuration may be such that the opening device 170 is arranged in a manner corresponding to the holding unit 60, and the number of the opening devices 170 is the same as that of the holding units 60. By employing the above aspect, a plurality of the holding members 162 can be made in an open state at the same timing. An opening mechanism may be configured with a plurality of the opening devices 170. In an aspect as shown in FIG. 14, the opening device 170 that opens the first holding unit 60a and the opening device 170 that opens the second holding unit 60b may constitute one opening mechanism, and the opening device 170 that opens the third holding unit 60c and the opening device 170 that opens the fourth holding unit 60d may constitute another opening mechanism.

Figure 15:
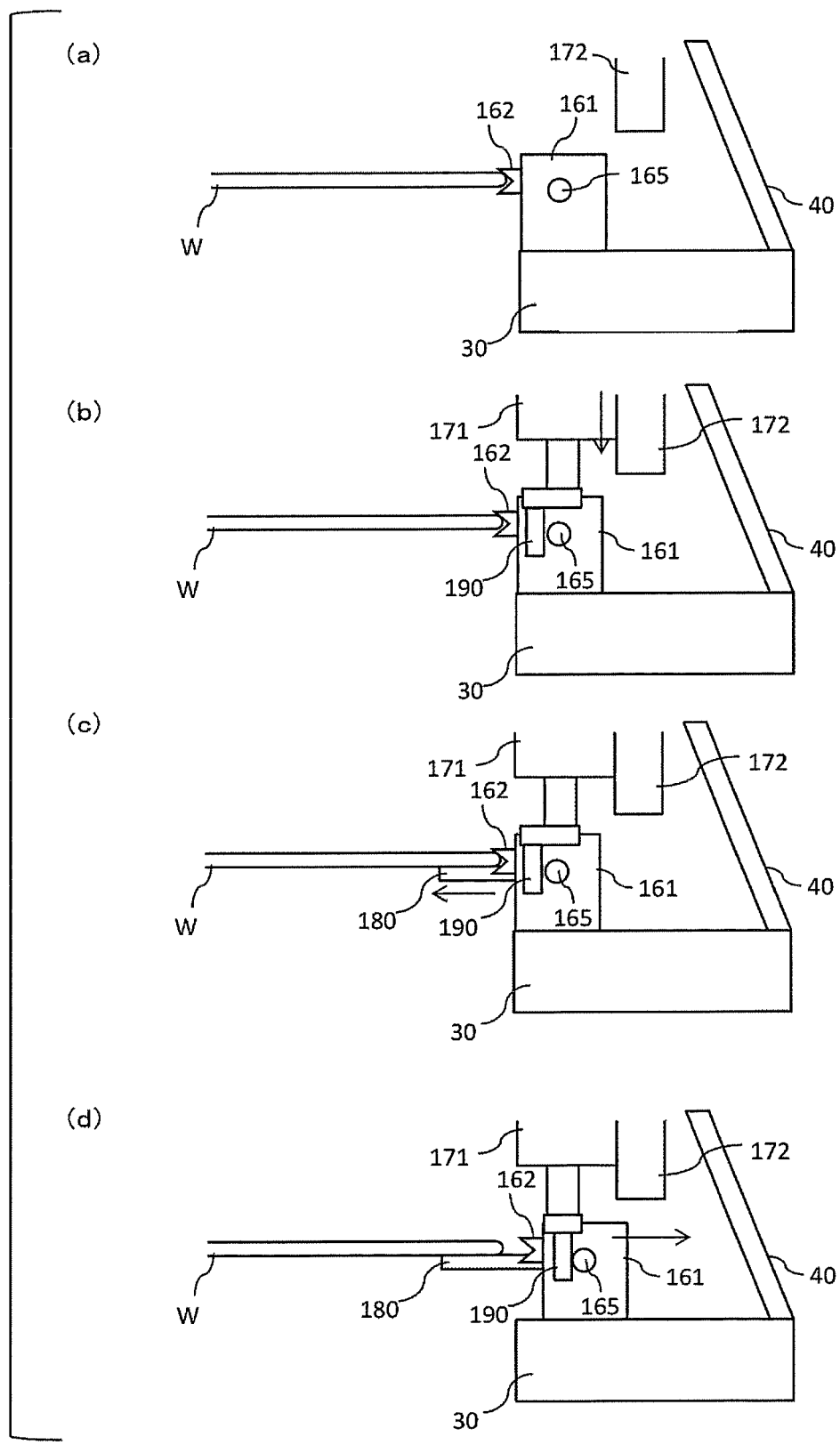
FIGS. 15 (*a*) to 15 (*d*) are side cross-sectional views showing a series of processes of a moving aspect of the holding member and the opening device that may be used in the second embodiment of the present invention.

The aspect may be such that the opening device 170 aproaches the holding unit 60 from the front surface side of the substrate W and makes the holding member 162 in an open state (refer to FIG. 15). However, the configuration is not limited to the above, and the opening device 170 may approach the holding unit 60 from the back-surface side of the substrate W, or may approach the holding unit 60 from a side of the substrate W. Note that employing the aspect in which the opening device 170 makes the holding member 162 in an open state by approaching the holding unit 60 from the front surface side of the substrate W is advantageous with respect to the point that the back surface of the substrate W can be cleaned easily since a device relating to an opening mechanism does not need to be provided on the back-surface side.

Figure 8:
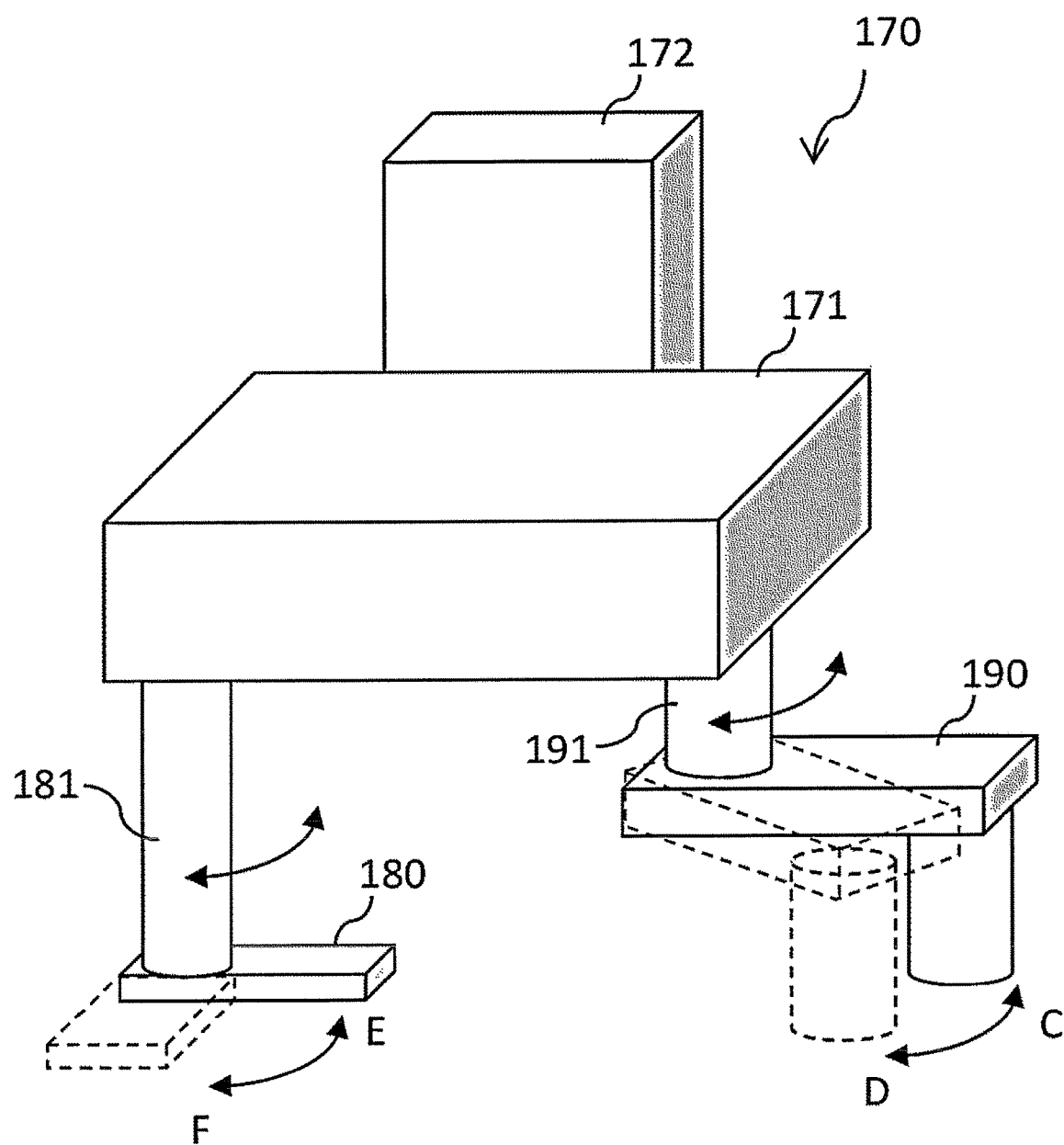
FIG. 8 is a perspective view of an opening device that may be used in the second embodiment of the present invention.

As shown in FIG. 8, the opening device 170 may have an opening main body unit 171 and a first direction movement unit 172 that moves the opening main body unit 171 along a first direction. For example, the first direction movement unit 172 may be an air cylinder. The opening device 170 may be attached to an inner peripheral surface of a one side part of the housing 5 of the apparatus for cleaning the substrate. For example, in a case where the housing 5 is separable into one side and the other side, the opening device 170 may be attached to an inner peripheral surface of the one side of the housing 5.

Employing the first direction movement unit 172 that moves a support member 180 and a pressing member 190 described later in the first direction is advantageous with respect to the point that the support member 180 and the pressing member 190 can be positioned at a retraction position (for example, a position closer to one side relative to the substrate W) when the opening device 170 is not used, such as when the substrate W is cleaned.

As shown in FIG. 7, the holding unit 60 may have a holding main body unit 161, a holding member 162 provided on a front-end side of the holding main body unit 161, a swinging shaft 163 that is provided between a front end and a base end of the holding main body unit 161 and used for swinging the holding member 162, and an elastic member 169 (refer to FIG. 9) used for pressing a front-end side of the holding member 162 to a peripheral inner side. The swinging shaft 163 may swing the holding member 162 in an in-plane direction. However, the configuration is not limited to the above, and the swinging shaft 163 may swing the holding member 162 in a manner inclined with respect to the in-plane direction, or along the first direction. Note that in the present embodiment, a side on which the holding member 162 is provided is referred to as the "front-end side" of the holding unit 60, and the opposite side is referred to as the "base-end side".

Figure 9:
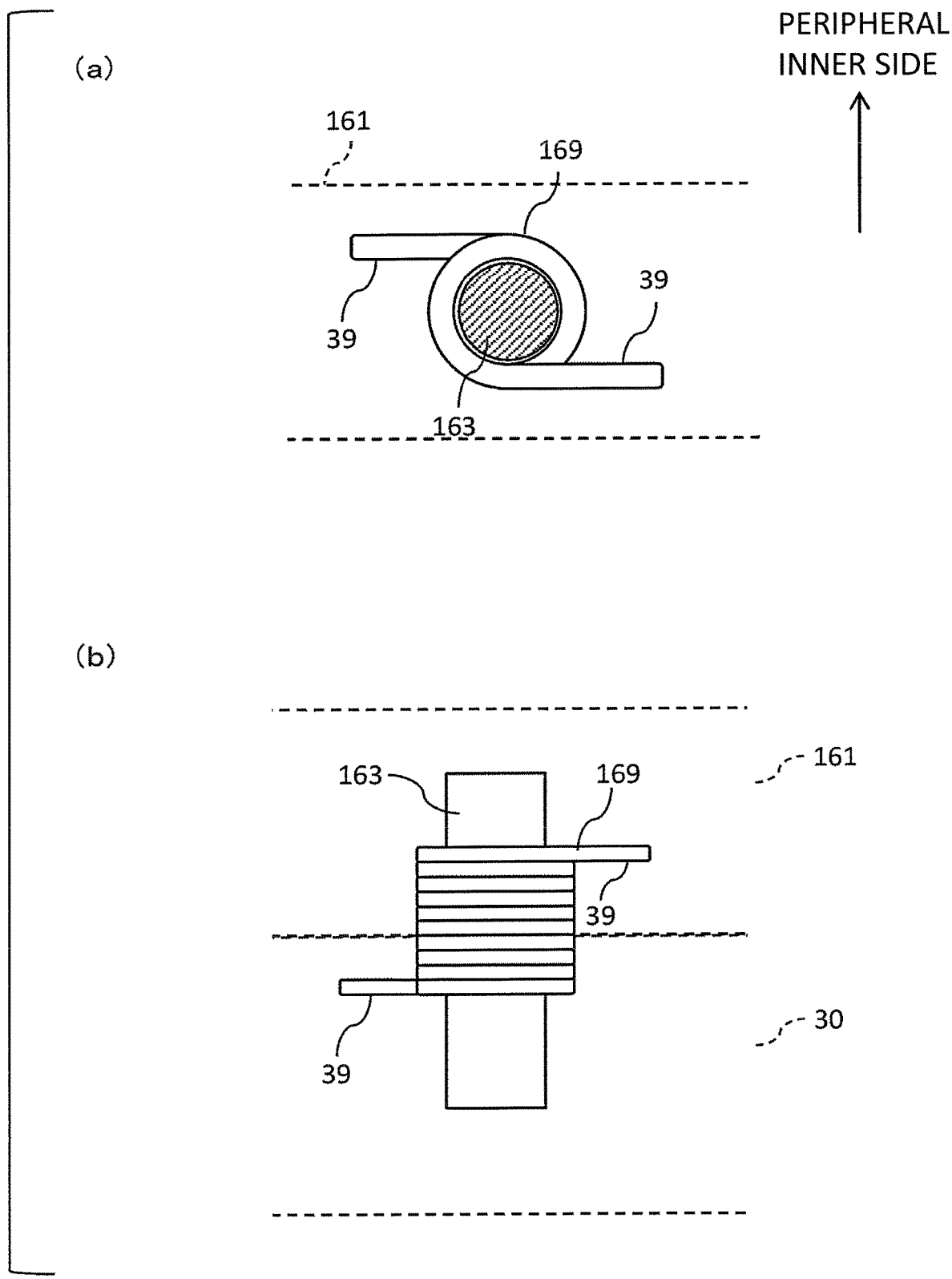
FIG. 9 (*a*) is a plan view of an elastic member that may be used in the second embodiment of the present invention, and FIG. 9 (*b*) is a side view of FIG. 9 (*a*).

The elastic member 169 may be provided in a manner abutting on the holding main body unit 161 and the rotated unit 30. As an example, the elastic member 169 may be a torsion spring provided in the holding main body unit 161 and the rotated unit 30 as shown in FIG. 9. In this case, the configuration may be such that one end side of the torsion spring abuts on a groove 39 provided on the rotated unit 30, and the other end side of the torsion spring abuts on the groove 39 provided on the holding main body unit 161. The holding unit 60 is swingably attached to the rotated unit 30 around the swinging shaft 163. The torsion spring as the elastic member 169 energizes the holding main body unit 163 in such a manner as rotating the holding main body unit 161 in a direction of an arrow A in FIG. 7 around the swinging shaft 163. The elastic member 169 energizes the front end of the holding member 162 in a direction of holding a peripheral part of a substrate. A state in which the holding member 162 holds a peripheral part of a substrate is referred to as the "closed state", and a state in which holding of a peripheral part of a substrate is released is referred to as the "open state".

Note that a front end on the arrow A direction side of the holding member 162 (that is, a part holding the substrate W of the holding member 162) may have a claw shape having a V-shaped cross section as shown in FIG. 15 and the like.

As shown in FIG. 8, the opening device 170 may have the support member 180 that supports the back surface of the substrate W when the holding member 162 is in the open state. The support member 180 may be provided on the other side end part of a support extending unit 181 that extends to the other side from the opening main body unit 171. The support member 180 may approach from the front surface side of the substrate W, move to the back-surface side of the substrate W, be positioned on the back-surface side of the substrate W before the holding member 162 becomes in the open state, and support the back surface of the substrate W when the holding member 162 is in the open state (refer to FIGS. 15 (b) and 15 (c)). In this case, the support extending unit 181 may be rotated and the support member 180 may be positioned on the back-surface side of the substrate W. Employing the aspect of rotating the support extending unit 181 as described above is advantageous with respect to the point that the support member 180 is not positioned on the front surface side of the substrate W (or in the first direction) when the opening device 170 is not used, such as when the substrate W is cleaned, and size in a radial direction of the substrate W is prevented from becoming large (even as compared with an aspect shown in a second variation described later). Note that a substrate support surface of the support member 180 may be an inclined surface that is inclined with respect to an in-plane direction of the substrate W, or may have a projecting part facing the back surface of the substrate W. Employing the above aspects is advantageous for reducing an area in contact with the back surface of the substrate W which leads to restriction of contact contamination.

In the aspect in which the rotation cup 40 is provided, the support member 180 may be positioned on the back-surface side of the substrate W after passing through a peripheral inner side of the rotation cup 40 and a peripheral outer side of the substrate W (refer to FIG. 15 (b)).

As shown in FIG. 8, the opening device 170 may have the pressing member 190 that moves along an in-plane direction of the substrate W. As shown in FIG. 7, the holding unit 60 may have a pressed member 165 pressed by the pressing member 190. Then, the holding member 162 may become in the open state by the pressed member 165 being pressed by the pressing member 190. The expression "along an in-plane direction" in the present embodiment means that there is a component along the in-plane direction, and an aspect of inclining with respect to the in-plane direction is also included. When the pressing unit 190 presses the pressed unit 165 in an opposite direction of the arrow A in FIG. 7, that is, in an arrow B direction, in such a manner as hanging a front end extending to the other side of the pressing unit 190 on the pressed unit 165, the holding unit 60 (the holding main body unit 161) swings in the arrow B direction against a biasing force of the elastic member 169.

In the aspect in which the rotation cup 40 is provided, the pressed member 165 may be provided between an inner periphery of the rotation cup 40 and an outer periphery of the substrate W when viewed from the front surface side of the substrate W (refer to FIG. 15).

As shown in FIG. 8, the pressing member 190 may be provided on the other side end part of a pressing extending unit 191 that extends to the other side from the opening main body unit 171. The pressing member 190 may approach from the front surface side of the substrate W like the support member 180. In this case, the configuration may be such that rotation of the pressing extending unit 191 causes the pressing member 190 to abut on the pressed member 165 and press the pressed member 165, so that the holding member 162 is opened (refer to FIG. 15 (*d*)). Employing the aspect of rotating the pressing extending unit 191 as described above is also advantageous with respect to the point that the pressing member 190 is not positioned on the front surface side of the substrate W (or in the first direction) when the opening device 170 is not used, such as when the substrate W is cleaned, and size in a radial direction of the substrate W is prevented from becoming large (even as compared with an aspect shown in a third variation described later).

The opening main body unit 171 may have a first actuator that rotates the pressing unit 190 with the pressing extending unit 191 as an axis, and a second actuator for rotating the support member 180 with the support extending unit 181 as an axis. The first actuator and the second actuator are, for example, a motor. In the examples shown in FIGS. 7 and 8, when the pressing unit 190 rotates in a direction of an arrow C and presses the pressed unit 165, the holding unit 60 rotates in a direction of the arrow B. Then, a front end of the holding member 162 moves away from a peripheral part of the substrate W, and holding of the substrate W is released. When holding of the substrate W is released or before such release, the support member 180 rotates in a direction of F, and supports the back surface of the substrate W. When the pressing unit 190 rotates in a direction of an arrow D from a state where the pressing unit 190 rotates in a direction of the arrow C and the holding unit 60 is caused to swing in a direction of the arrow B so that holding of a substrate is released, the holding unit 60 swings in a direction of the arrow A by a biasing force of the elastic member 169, and a front end of the holding member 162 holds a peripheral part of the substrate W. When the holding unit 60 holds the substrate W, the support member 180 rotates in a direction of an arrow E, and is positioned on an outer side than a peripheral part of the substrate W.

An example of an aspect of releasing the held substrate W will be described with reference to FIG. 15.

First, the support member 180 and the pressing member 190 approach from the front surface side of the substrate W, pass through between the rotation cup 40 and the substrate W, and are positioned on the back-surface side of the substrate W (refer to FIGS. 15 (*a*) and 15 (*b*)). For example, a distance between the rotation cup 40 and the substrate W may be around 20 to 30 mm. Operation of the support member 180 and the pressing member 190 approaching from the front surface side of the substrate W and being positioned on the back-surface side of the substrate W is performed when the first direction movement unit 172 of the opening device 170 moves the opening main body unit 171 along the first direction.

Next, the support extending unit 181 is rotated and the support member 180 is positioned on the back-surface side of the substrate W (refer to FIG. 15 (*c*)).

Next, the pressing extending unit 191 is rotated, the pressed member 165 is pressed by the pressing member 190, and the holding member 162 becomes in the open state (refer to FIG. 15 (*d*)). With the holding member 162 becoming in the open state as described above, the back surface of the substrate W is supported by the support member 180.

Next, the substrate W supported by the support member 180 is moved to one side by the opening device 170, and is stopped after the substrate W is moved to the one side farther than the one side end part of the holding member 162. After that, the pressing extending unit 191 is rotated in a direction opposite to the direction described above, and the holding member 162 returns to an original position. By employing the above aspect, the holding member 162 can be prevented from closing rapidly due to the pressing member 190 coming out of the pressed member 165.

Next, the substrate W supported by the support member 180 is moved further to the one side by the opening device 170. After that, the second conveying robot 126 or the third conveying robot 128 receives the substrate W from the opening device 170. The substrate W is preferably moved to a position higher than the rotation cup 40 and the fixing cup 45. When the second conveying robot 126 or the third conveying robot 128 receives the substrate W from the opening device 170, a hand of the second conveying robot 126 or the third conveying robot 128 supports the second surface of the substrate W. After that, the support member 180 swings from a position at which to support the substrate W to an outer side of an outer periphery of the substrate W. Then, the hand moves the substrate W to the other side by a predetermined distance, and further carries the substrate W to the outside of the housing 5. With the hand of the second conveying robot 126 or the third conveying robot 128 carrying the substrate W in the above manner, the substrate can be carried without interference between the substrate W and the support extending unit 181.

The operation of the opening device 170 moving the substrate W to the one side is performed by the first direction movement unit 172 of the opening device 170 moving the opening main body unit 171 along the first direction.

The first direction movement unit 172 moves the support member 180 and the pressing member 190 along the first direction. Accordingly, the first direction movement unit 172 can also be referred to as an opening device moving unit. Furthermore, when a focus is placed particularly on moving the pressing member 190, the first direction movement unit 172 can also be referred to as a pressing member movement unit.

Note that to perform a process of causing the holding member 162 to hold the substrate W, a process opposite to the process described above is preferably performed.

Employing the above aspect is advantageous with respect to the point that as the rotation cup 40 is used, the opening device 170 does not need to be provided on the back-surface side of the substrate W. Furthermore, employing the above aspect is also advantageous with respect to the point that a hole for allowing the support member 180 or the pressing member 190 to pass through does not need to be provided on the rotation cup 40. Note that providing a hole on the rotation cup 40 causes problems, such as turbulence of an air current and leakage of a cleaning solution to the outside.

A case where the one side corresponds to an upper side of the substrate W and the opening device 170 is positioned on the upper side of the substrate W is advantageous with respect to the point that a water-proof configuration of the opening device 170 can be simplified.

Figure 10:
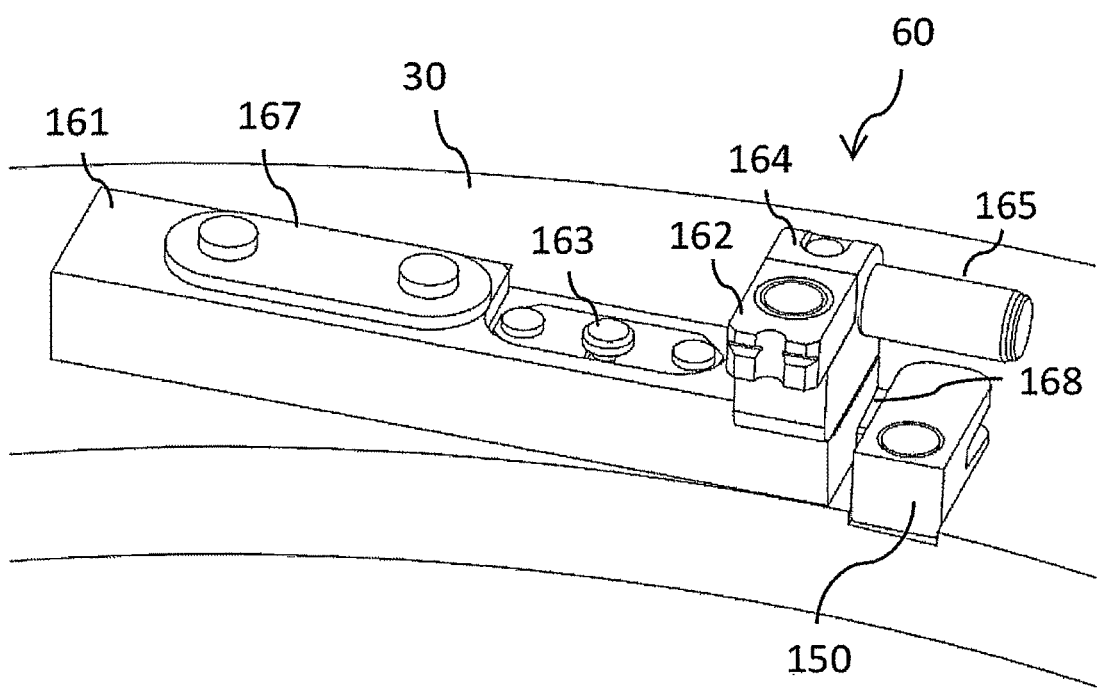
FIG. 10 is a perspective view of another holding unit that may be used in the second embodiment of the present invention.

As shown in FIG. 10, the holding unit 60 may have a weight member 167 provided closer to the base end relative to the swinging shaft 163. Due to a centrifugal force that acts on the weight member 167 when the holding unit 60 is rotated, the holding member 162 receives a force in a direction toward a peripheral inner side of a substrate. Accordingly, a force of holding a substrate can be increased.

In the aspect shown in FIG. 13, the holding unit 60 has the first holding unit 60a, the second holding unit 60b, the third holding unit 60c, and the fourth holding unit 60d. Each of the holding units 60 (60a to 60d) may have the holding main body unit 161, the holding member 162 provided on a front-end side of the holding main body unit 161, the weight member 167 provided on the base-end side of the holding main body unit 161, the swinging shaft 163 that is provided between the front end and the base end of the holding main body unit 161 and used for swinging the holding member 162, and the elastic member 169 used for pressing the base-end side of the holding main body unit 161 to a peripheral inner side. Part of the holding units 60 (60a to 60d) may have an aspect different from the others. For example, the configuration may be such that the weight member 167 is not provided in part of the holding units 60 (60a to 60d), or a weight of the weight member 167 is different between the holding units 60 (60a to 60d).

In the aspect shown in FIG. 13, the first holding unit 60a has a first holding main body unit 161a, a first holding member 162a, a first weight member 167a, a first swinging shaft 163a, and a first elastic member 169a. The second holding unit 60b has a second holding main body unit 161b, a second holding member 162b, a second weight member 167b, a second swinging shaft 163b, and a second elastic member 169b. The third holding unit 60c has a third holding main body unit 161c, a third holding member 162c, a third weight member 167c, a third swinging shaft 163c, and a third elastic member 169c. The fourth holding unit 60d has a fourth holding main body unit 161d, a fourth holding member 162d, a fourth weight member 167d, a fourth swinging shaft 163d, and a fourth elastic member 169d. Note that each of the holding units 60 does not need to be arranged in the same aspect when viewed along a rotating direction (for example, a clockwise direction in FIG. 13) of the substrate W, and may be oriented in different directions with respect to the rotating direction of the substrate W as shown in FIG. 14. In the aspect shown in FIG. 14, the first holding unit 60a and the third holding unit 60c are oriented in the same direction with respect to the rotating direction of the substrate W, the second holding unit 60b and the fourth holding unit 60d are oriented in the same direction with respect to the rotating direction of the substrate W, and the first holding unit 60a and the third holding unit 60c, and the second holding unit 60b and the fourth holding unit 60d are oriented in different directions with respect to the rotating direction of the substrate W.

A metal plate, such as a stainless plate, may be used as the weight member 167. The weight member 167 may be provided on the one side or the other side of the holding main body unit 161. However, when the holding unit 60 is provided on a surface on the one side of the rotated unit 30, the weight member 167 is more preferably provided on a surface on the one side of the holding main body unit 161 from the viewpoint of avoiding unnecessary friction generated with the rotated unit 30. By using a metal plate, a thickness can be reduced, and turbulence of an air current at the time of rotation can be restricted. Size of the metal plate may be, for example, 10 mm in width×30 mm in length×1.5 mm in thickness, and a weight may be, for example, around 2 to 12 g. Note that when the weight member 167 is made from metal, a surface of the weight member 167 is preferably coated with resin (PFA, PTFE, or the like) to prevent corrosion of metal and metal contamination on the substrate W.

The weight member 167 is removable from the holding main body unit 161, and the weight member 167 may be replaceable as appropriate depending on a rotation speed, a type of the substrate W to be treated, and the like. Employing the above aspect is advantageous with respect to the point that a weight of the weight member 167 can be changed in accordance with a situation, and an option of not using the weight member 167 can be chosen in some cases.

The weight member 167 may be provided on the holding main body unit 161 so that a weight of the holding unit 60 is increased by around 10% to 60%. Note that a weight of each of the holding units 60 when the weight member 167 is not provided may be, for example, around 20 g.

As shown in FIG. 10, the holding projection unit 164 that projects to the one side on the front-end side may be provided on the holding main body unit 161. The holding member 162 may be removable from the holding projection unit 164. Employing the above aspect is advantageous with respect to the point that the holding member 162 is replaceable as appropriate, contamination of the holding member 162 is prevented, and the holding member 162 that happens to be contaminated can be directly replaced. Note that a part in which the holding member 162 and the substrate W abut on each other may have a coefficient of friction that is larger than or equal to a threshold value, causing the substrate W hardly sliding.

Each of the holding members 162 may be provided on the holding projection unit 164. Each of the holding members 162 may have a claw shape for sandwiching the substrate W. The claw shape may project by around 1 mm. Having the short projection as described above is advantageous with respect to the point that the substrate W can be cleaned to an extreme end part on the periphery, and reverse contamination can be prevented as much as possible.

Providing the holding projection unit 164 as shown in FIG. 10 is advantageous with respect to the point that the holding member 162 can be positioned at a position away from the holding main body unit 161, and possibility that the holding main body unit 161 and a member, such as the weight member 167, provided on the holding main body unit 161 are erroneously in contact with the substrate W can be reduced.

The pressed member 165 may be provided on a side surface of the holding projection unit 164. The pressed member 165 may be a bar member that extends in the in-plane direction. The bar member may have a cylindrical shape or a rectangular column shape, and can employ any shape.

Figure 12:
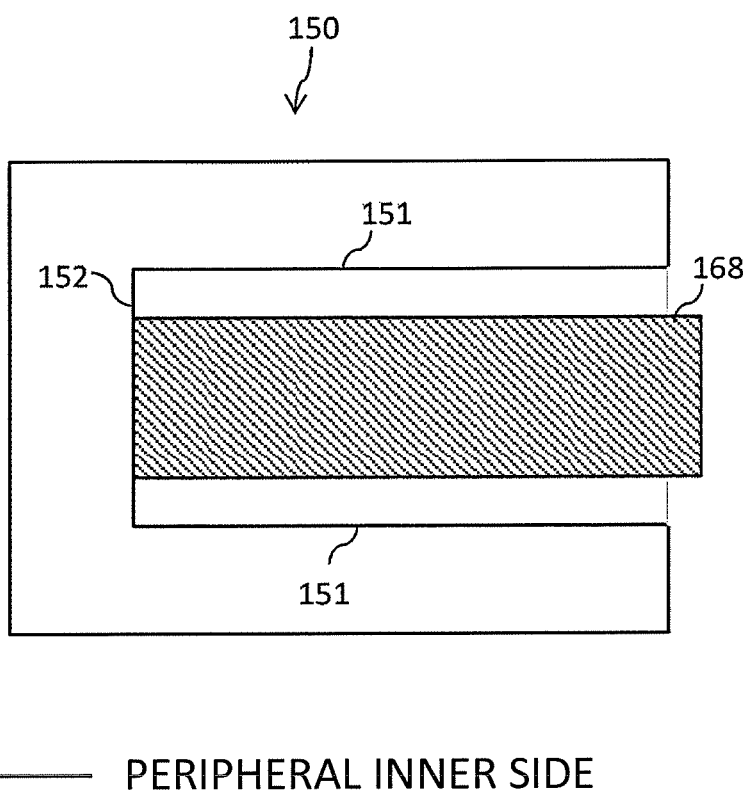
FIG. 12 is a side cross-sectional view showing a projection unit and a stopper that may be used in the second embodiment of the present invention.

A rotation regulation mechanism that regulates pressing by the holding member 162 may also be provided. The holding unit 60 may have a regulated unit for regulating movement to an inner peripheral side of the holding member 162, and the rotated unit 30 may have a regulating unit for regulating movement of the regulated unit. More specifically, as shown in FIG. 10, a projection unit 168 as an example of the regulated unit may be provided on the front-end side of the holding main body unit 161, and a stopper 150 as an example of the regulating unit abutting on the projection unit 168 may be provided on the rotated unit 30. As shown in FIG. 12, the stopper 150 may have a pair of stopper surfaces 151 provided on one side and the other side of the projection unit 168 and a stopper abutting unit 152 that is provided between a pair of the stopper surfaces 151 and abuts on the projection unit 168. By providing the stopper surface 151, the projection unit 168 can be prevented from erroneously moving to a peripheral inner side beyond the stopper abutting unit 152.

The regulated unit does not need to be provided on the front-end side of the holding main body unit 161, and may be provided, for example, on the base-end side of the holding main body unit 161, and a regulating unit, such as a stopper, may be provided in accordance with the regulated unit.

Figure 11:
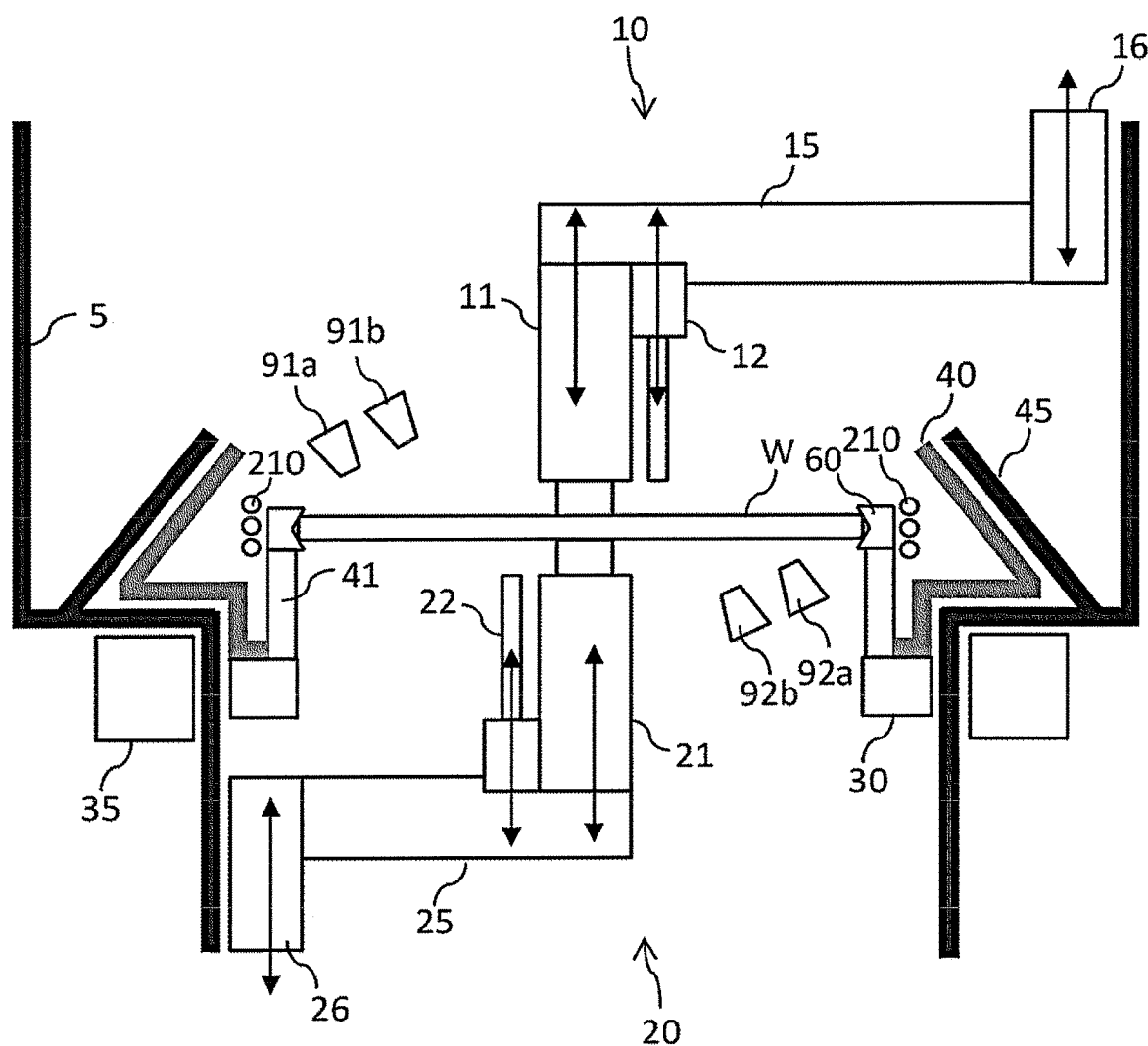
FIG. 11 is a side cross-sectional view of an apparatus for cleaning the substrate that may be used in the second embodiment of the present invention.

When the rotated unit 30 is rotated in the non-contact aspect like the first embodiment, the substrate W may be adversely affected by a charge generated when the substrate W is processed, and there is possibility that a circuit, if any, formed on the substrate W is destroyed. For this reason, part or whole of the holding member 162 may be configured with conductive resin. For example, publicly-known resin containing a small amount of carbon nanotube can be employed as the conductive resin. The "part" means that, for example, only a surface is constituted by a member provided with conductivity Then, a conductive fiber 210 (refer to FIG. 11), such as a string having a diameter of several μm into which stainless is woven, a metal-plated fiber, and a fiber including carbon, may be provided adjacent to and in the vicinity of the holding member 162 of the rotated unit 30. Note that "adjacent" (adjacent and in the vicinity) means that none of the other members exists between them. For this reason, that the holding member 162 and the conductive fiber 210 are adjacent to and in the vicinity of each other means that no member other than members constituting the holding member 162 and the conductive fiber 210 is provided between the holding member 162 and the conductive fiber 210 (for example, a member that covers the conductive fiber 210 is a member constituting the conductive fiber 210 and such a member may be provided). Employing the above aspect is advantageous with respect to the point that charges accumulated on the substrate W through the conductive fiber 210 are discharged by a corona discharge effect, and an adverse effect on the substrate W caused by a charge can be prevented. Note that providing a member including the conductive fiber 210 in the vicinity of the holding unit 60 includes not only a case where a member having a certain shape (for example, an annular ring) on an outer periphery of the holding member 162 as shown in FIG. 11, but also a case where, for example, a member is provided on an inner side of the holding member 162. Note that when hydrogen peroxide water-mixed pure water in which hydrogen peroxide water is mixed and carbon dioxide-mixed pure water obtained by mixing carbon dioxide in pure water (DIW) are supplied as a cleaning solution to a substrate in combination with the present configuration, a discharging effect for eliminating a charge on the substrate W can be improved.

(First Variation)

Figure 16:
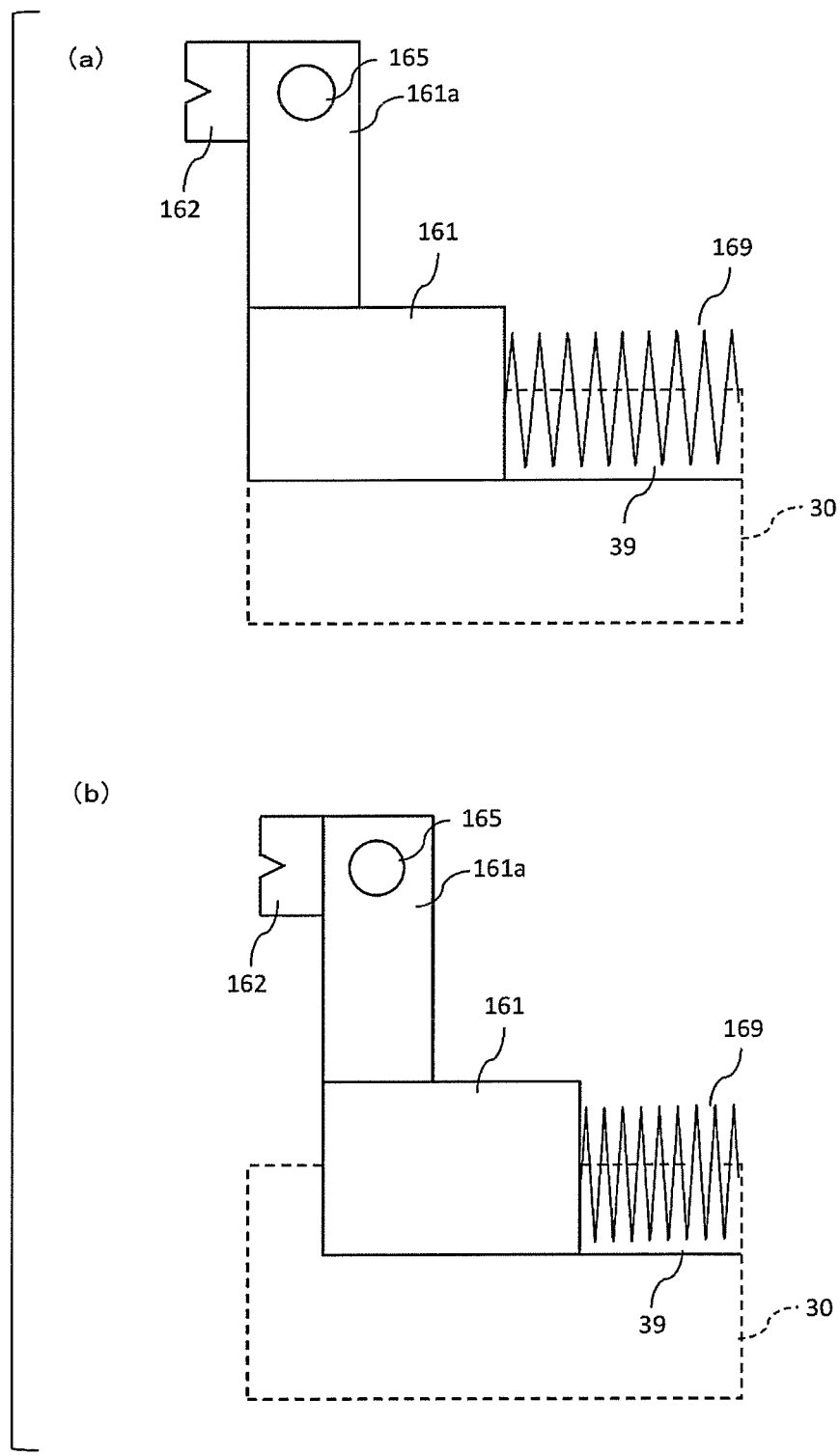
FIG. 16 (*a*) is a side cross-sectional view showing the holding unit that may be used in a first variation of the second embodiment of the present invention, and FIG. 16 (*b*) is a side cross-sectional view showing an aspect when the holding member is in an open state in FIG. 16 (*a*).

The above description uses the aspect in which the holding member 162 swings around the swinging shaft 163. However, the configuration is not limited to the above, and the holding member 162 may be slidable with respect to the rotated unit 30 as shown in FIG. 16. As an example of the aspect, the elastic member 169 may be a spring provided in the holding main body unit 161 and the rotated unit 30. In this case, the configuration may be such that one end of the elastic member 169, such as a spring, abuts on an inner peripheral surface of a groove of the rotated unit 30, and the other end of the elastic member 169 abuts on the holding main body unit 161. Note that in a variation, a holding force of the holding member 162 is lowered when a centrifugal force acts. From this viewpoint, the aspect in which the holding member 162 swings as described above is preferable. An elastic force of the elastic member 169 is considered to be increased in order to increase a holding force. However, increasing an elastic force is not preferable since the elastic member 169 becomes large.

(Second Variation)

Figure 17:
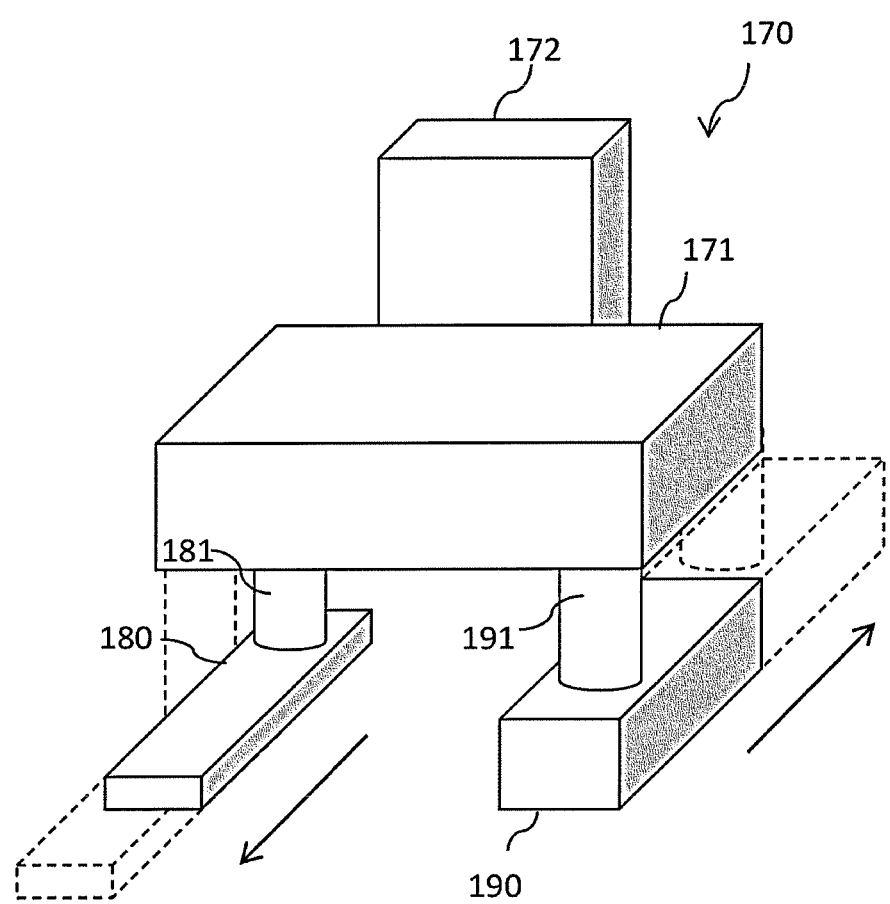
FIG. 17 is a perspective view of the opening device that may be used in a second variation and a third variation of the second embodiment of the present invention.

The above describes the aspect in which the support extending unit 181 is rotated on the back-surface side of the substrate W before the holding member 162 becomes in the open state, and the support member 180 is positioned on the back-surface side of the substrate W (refer to FIG. 15 (*c*)). However, the configuration is not limited to this aspect, and there may be an aspect in which the support member 180 is positioned on the back-surface side of the substrate W when the support extending unit 181 slides on the back-surface side of the substrate W before the holding member 162 becomes in the open state as shown in FIG. 17. In this case, the support extending unit 181 may slide in an in-plane direction so that the support member 180 is positioned on the back-surface side of the substrate W.

(Third Variation)

The above describes the aspect in which the pressing extending unit 191 is rotated and the pressing member 190 abuts on the pressed member 165 and presses the pressed member 165, so that the holding member 162 is opened (refer to FIG. 15 (*d*)). However, the configuration is not limited to the above, and the pressing member 190 may slide to press the pressed member 165 so that the holding member 162 is opened as shown in FIG. 17. In this case, the pressing extending unit 191 may slide in the in-plane direction so that the pressing member 190 slides.

(Fourth Variation)

In the above description, the opening device 170 has not only the pressing member 190 but also the support member 180. However, the configuration may be such that the opening device 170 has only the pressing member 190, and the support member 180 that supports the back surface of the substrate W supports and separates the substrate W by a mechanism unit separate from the opening device 170.

(Fifth Variation)

Figure 18:
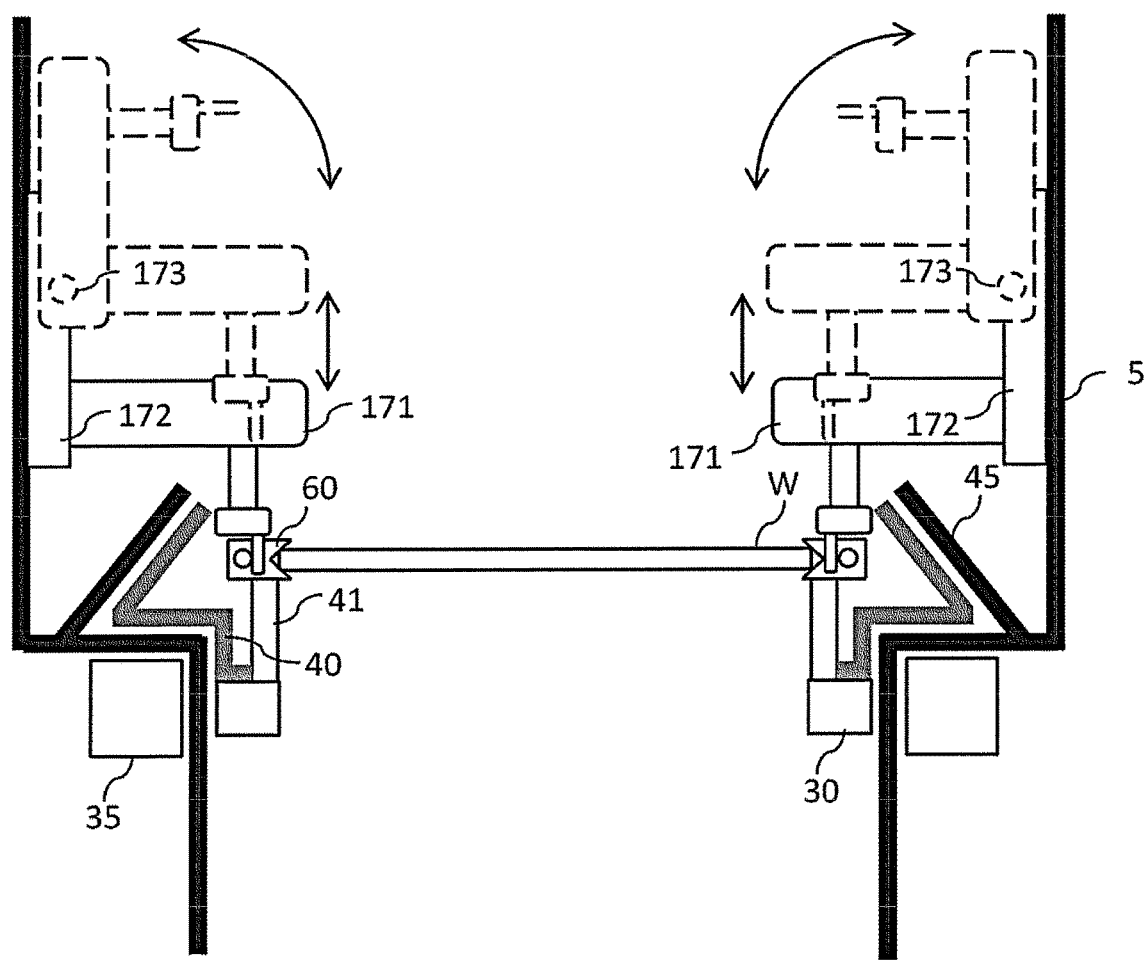
FIG. 18 is a side cross-sectional view showing an opening device fixing unit that may be used in a fifth variation of the second embodiment of the present invention.

The above describes the aspect in which one of the opening device 170 has a first actuator that swings one of the pressing member 190 in the in-plane direction and a second actuator that swings one of the support member 180 in the in-plane direction. However, the configuration is not limited to this aspect. As an example, the configuration may be such that one of the opening device 170 swings two of the pressing members 190 in the in-plane direction, and also swings two of the support members 180 in the in-plane direction. In an aspect shown in FIG. 18, the opening device 170 shown on the left of FIG. 18 has two of the pressing members 190 and two of the support members 180, and the opening device 170 shown on the right of FIG. 18 has two of the pressing members 190 and two of the support members 180. The opening device 170 also has a swinging mechanism 173 that swings the opening main body unit 171 to one side and the other side. The first direction movement unit 172 can move the opening main body unit 171 and the swinging mechanism 173 along the first direction.

In the present variation, the opening main body unit 171 is caused to swing to one side so as to be positioned along an inner surface of the housing 5, and is positioned at a second retraction position. On the other hand, the opening main body unit 171 is caused to swing to the other side so as to be positioned at a first retraction position from the second retraction position, and the opening main body unit 171 moves from the first retraction position to the other side so as to be positioned at a use position. Like this aspect, the opening main body unit 171 is positioned at retraction positions including the first retraction position and the second retraction position. In this manner, the opening device 170 can be prevented from becoming an obstacle in a cleaning process and the like. In particular, when the opening main body unit 171 is positioned at the second retraction position, a more significant effect can be obtained. Note that after the opening main body unit 171 is caused to swing to the other side, the opening main body unit 171 is moved to the other side. In this manner, the pressing member 190 is positioned on a side of the pressed member 165, and the support member 180 can be positioned on the back-surface side of the substrate W (this position is the use position described above). The first retraction position described above is a transferring position of the substrate W. At the first retraction position, the second conveying robot 126 or the third conveying robot 128 receives the substrate W from the opening device 170, or the opening device 170 receives the substrate W from the second conveying robot 126 or the third conveying robot 128.

The present variation shows the aspect in which one of the opening device 170 swings two of the pressing members 190 in the in-plane direction, and also swings two of the support members 180 in the in-plane direction. However, the configuration is not limited to this aspect. An aspect in which one of the opening device 170 swings all four of the pressing members 190 in the in-plane direction, and also swings all four of the support members 180 in the in-plane direction may also be employed. In this case as well, the swinging mechanism 173 that swings the opening main body unit 171 to one side and the other side may be provided. However, in a case where the aspect of swinging all four of the pressing members 190 in the in-plane direction and all four of the support members 180 in the in-plane direction is employed, when the aspect of swinging the opening main body unit 171 to one side or the other side is employed, size of the device in the first direction becomes large. From the above viewpoint, employing the aspect of swinging the opening main body unit 171 to one side and the other side in the aspect in which one of the opening device 170 swings two of the pressing members 190 and two of the support members 180 in the in-plane direction as described above is advantageous with respect to the point that size of the device in the first direction can be prevented from becoming large.

Third Embodiment

Next, the third embodiment of the present invention will be described.

In the present embodiment, a first biasing force provided to a certain holding member 162 is larger than a second biasing force provided to another holding member 162. More specifically, the holding unit 60 has the elastic member 169, such as a spring. The elastic member 169 of a certain one of the holding unit 60 provides a biasing force that is larger than that provided by the elastic member 169 of another one of the holding unit 60 (for example, has a higher spring constant). The other configurations are similar to those of the above embodiments, and all the aspects described in the above embodiments can be employed. The members described in the above embodiments will be described by using the same reference signs.

Figure 19:
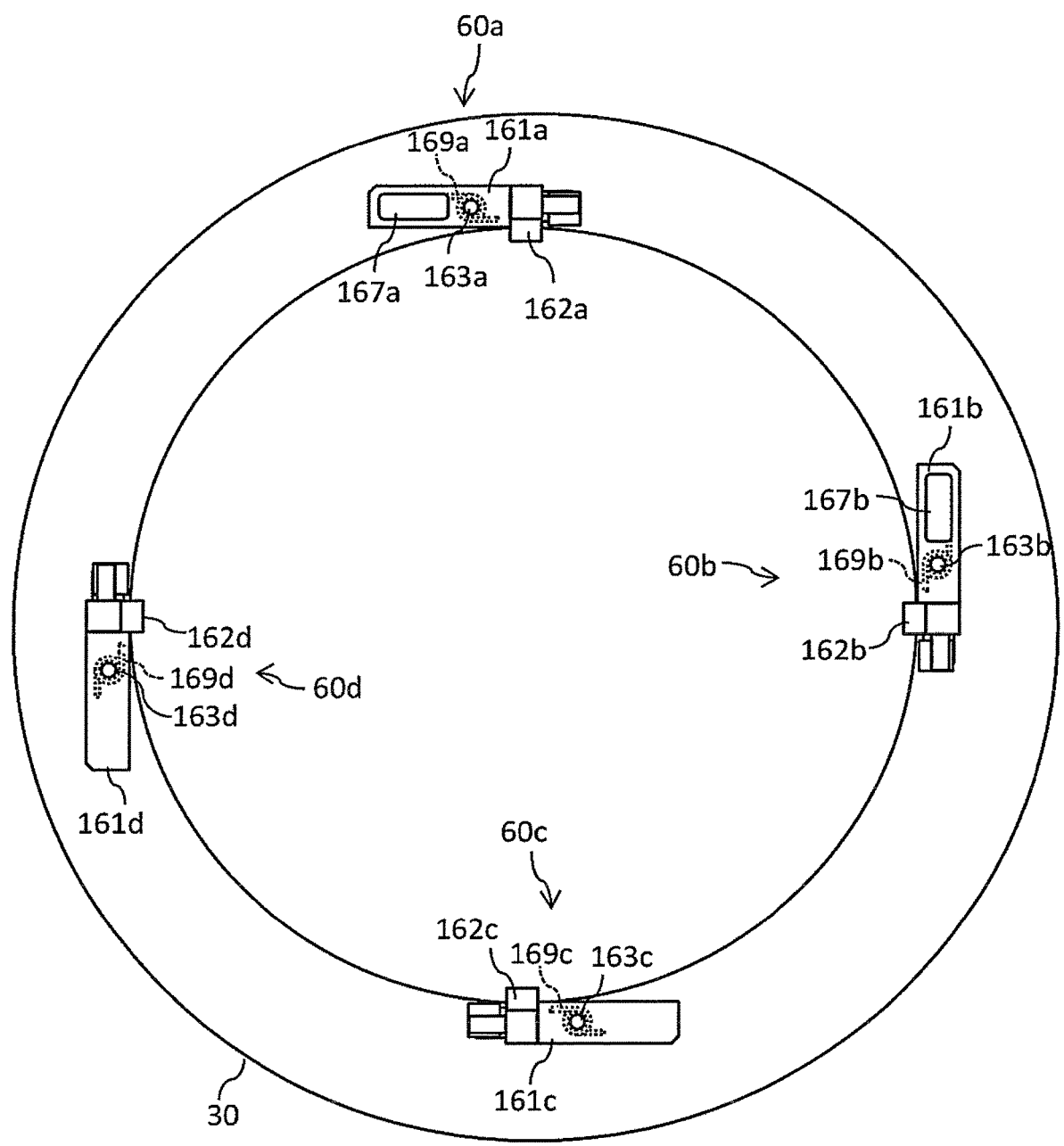
FIG. 19 is a plan view showing a plurality of holding units provided in a rotated unit that may be used in a third embodiment of the present invention.

As an example, a biasing force of the elastic members 169 of adjacent ones of the holding units 60 (for example, the first holding unit 60a and the second holding unit 60b) may be larger than a biasing force of the elastic members 169 of other adjacent ones of the holding units 60 (for example, the third holding unit 60c and the fourth holding unit 60d) (refer to FIG. 19). When the above aspect is employed, the substrate W receiving a force from the elastic member 169 having a large biasing force is pressed to the holding unit 60 side having the elastic member 169 having a smaller biasing force, and the substrate W is positioned in a location where the biasing forces are balanced. This aspect is advantageous with respect to the point that a position of the substrate W can be set to a certain degree by differentiating biasing forces of the elastic members 169. That is, when biasing forces of the elastic members 169 are the same, a position at a time point at which the substrate W is held is not set, or a center position of the substrate W is shifted by a centrifugal force generated by rotation of the substrate W, and in some cases, there is a danger that the substrate W is removed from the holding member 162. With respect to this point, shifting of a center position of the substrate W caused by a centrifugal force can be restricted by making an biasing force of part of the elastic members 169 larger than an biasing force of the remaining elastic members 169, and possibility that the substrate W comes off from the holding member 162 can be reduced.

Note that when only three of the holding units 60 are provided, a biasing force of the elastic members 169 of two of the holding units 60 may be larger than a biasing force of the elastic member 169 of the other holding units 60. According to the above aspect, the substrate W can be positioned by the elastic members 169 having a large biasing force of two of the holding units 60.

The configuration may be such that only the holding unit 60, in which the elastic member 169 has a large biasing force, has the weight member 167. The above aspect is advantageous with respect to the point that the substrate W can be positioned at a predetermined position by both a difference in biasing forces of the elastic members 169 and a difference in centrifugal forces generated by the weight member 167 when the substrate W is rotated. In an aspect shown in FIG. 19, the first holding unit 60a has a first weight member 167a and the second holding unit 60b has a second weight member 167b, while the third holding unit 60c does not have a third weight member 167c and the fourth holding unit 60d does not have a fourth weight member 167d.

A weight of the weight member 167 of the holding unit 60, in which the elastic member 169 has a large biasing force, may be larger than a weight of the weight member 167 of the holding unit 60, in which the elastic member 169 has a small biasing force. This aspect is advantageous with respect to the point that the substrate W can be positioned by a difference in centrifugal forces generated by the weight members 167 while a holding force of the holding unit 60 is increased by the centrifugal forces.

Note that the configuration may be such that biasing forces of the elastic members 169 are not differentiated, and a way that a centrifugal force acts is adjusted depending on whether or not to provide the weight member 167 or a difference in weights of the weight members 167, so that the rotating substrate W is positioned to a certain degree.

Positions of the stopper 150 do not need to be even. As an example, the configuration may be such that, for adjacent two of four of the holding units 60, the stoppers 150 are positioned so that the holding members 162 are closed only to a standard dimension (for example, a diameter of 300 mm) of the substrate W, and, on the other hand, for the remaining two, the stoppers 150 are positioned so that the holding members 162 are closed to a position (for example, a diameter of 295 mm) smaller than the standard dimension.

Movement of a holding member, provided with a large first biasing force, to an inner side may be regulated on a peripheral outer side relative to the holding member provided with a smaller second biasing force. For example, the stopper 150 corresponding to the holding unit 60 having a large biasing force may be positioned so that the holding member 162 is closed only to a standard dimension (for example, a diameter of 300 mm) of the substrate W. In the above example, the stoppers 150 corresponding to the first holding unit 60a and the second holding unit 60b may be positioned so that the holding member 162 is closed only to the standard dimension (for example, a diameter of 300 mm). The substrate W, which is pressed in-plane by the elastic member 150 having a large biasing force (for example, a first elastic member 150a and a second elastic member 150b), is not pressed beyond the standard dimension by the stopper 150. As a result, the aspect is advantageous with respect to the point that the substrate W can be held in accordance with the standard dimension of the substrate W. Note that a difference in biasing forces between the elastic member 150 having a large biasing force (for example, the first elastic member 150a and the second elastic member 150b) and the elastic member 150 having a small biasing force (for example, a third elastic member 150c and a fourth elastic member 150d) is preferably larger than a degree of the holding member 162, which corresponds to the elastic member 150 having a large biasing force, abutting by the stopper 150. This is because, by employing the above aspect, it is ensured that positioning can be performed by the holding member 162 corresponding to the elastic member 150 having a large biasing force.

Each of the holding members 162 may be opened to a position (for example, a diameter of 305 mm) larger than the standard dimension of the substrate W. By allowing the holding member 162 to be opened to a position larger than the standard dimension of the substrate W as described above, the substrate W can be held easily by the holding member 162. In the present embodiment, since the rotated unit 30 is rotated in a floating state without being in contact with any part of the housing 5, the rotated unit 30 is sometimes shifted from an original center position when stopped. With respect to this point, allowing the holding member 162 to be opened to a position larger than the standard dimension of the substrate W is advantageous with respect to the point that the substrate W can be held by the holding member 162 even when the position of the rotated unit 30 is shifted.

Fourth Embodiment

Next, the fourth embodiment of the present invention will be described.

In the second and third embodiments described above, the aspect is such that the support member 180 approaches from the front surface side of the substrate W. In the present embodiment, the aspect is such that the support member 180 approaches from the back-surface side of the substrate W. The other configurations are similar to those of the above embodiments, and all the aspects described in the above embodiments can be employed. The members described in the above embodiments will be described by using the same reference signs.

Figure 20:
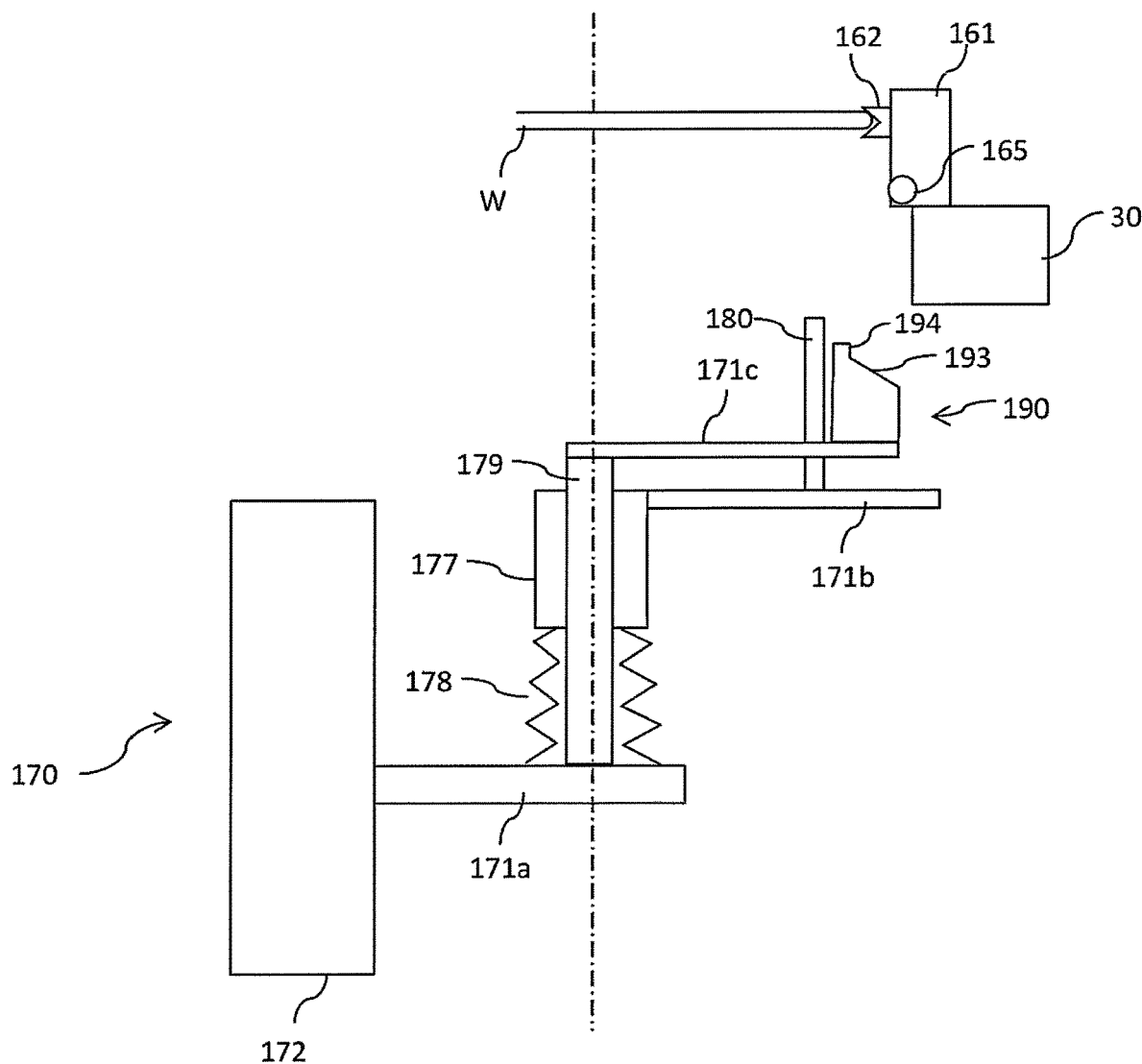
FIG. 20 is a side cross-sectional view showing the holding member and the opening device that may be used in a fourth embodiment of the present invention.

As shown in FIG. 20, in the present embodiment, the support member 180 is positioned on the other side (the back-surface side) of the substrate W, and the pressing member 190 is positioned on the other side of the pressed member 165. The aspect in which the opening device 170 approaches from the back-surface side of the substrate W as in the present embodiment is advantageous with respect to the point that the opening device 170 has a simple configuration. On the other hand, it needs to be noted that when the opening device 170 is provided on the back-surface side of the substrate W as described above, the back-surface side of the substrate W is occupied by the opening device 170, and cleaning of the back-surface side of the substrate W becomes less easy.

Note that in the present embodiment, an aspect in which a device similar to the opening device 170 used in the second and third embodiments is positioned on the back-surface side of the substrate W can also be employed.

In the present embodiment, as an example, the opening device 170 may have the first direction movement unit 172, a first opening main body unit 171a that is moved along the first direction by the first direction movement unit 172, a second opening main body unit 171b that is provided on the first opening main body unit 171a with an elastic member 178, such as a spring, provided between them and is used for supporting the support member 180, and a third opening main body unit 171c that is provided on the first opening main body unit 171a with a linear motion member 179, such as a spline shaft, provided between them and is used for supporting the pressing member 190. As shown in FIG. 20, the second opening main body unit 171b may be connected to the first opening main body unit 171a with the elastic member 178 and a connection member 177 provided between them. The pressing member 190 of the present embodiment may have a pressing guide surface 193 that is inclined to the other side toward a peripheral outer side and used for guiding the pressed member 165, and a pressing support member 194 that is provided on the pressing guide surface 193 and receives the back surface of the substrate W supported by the support member 180.

Figure 21:
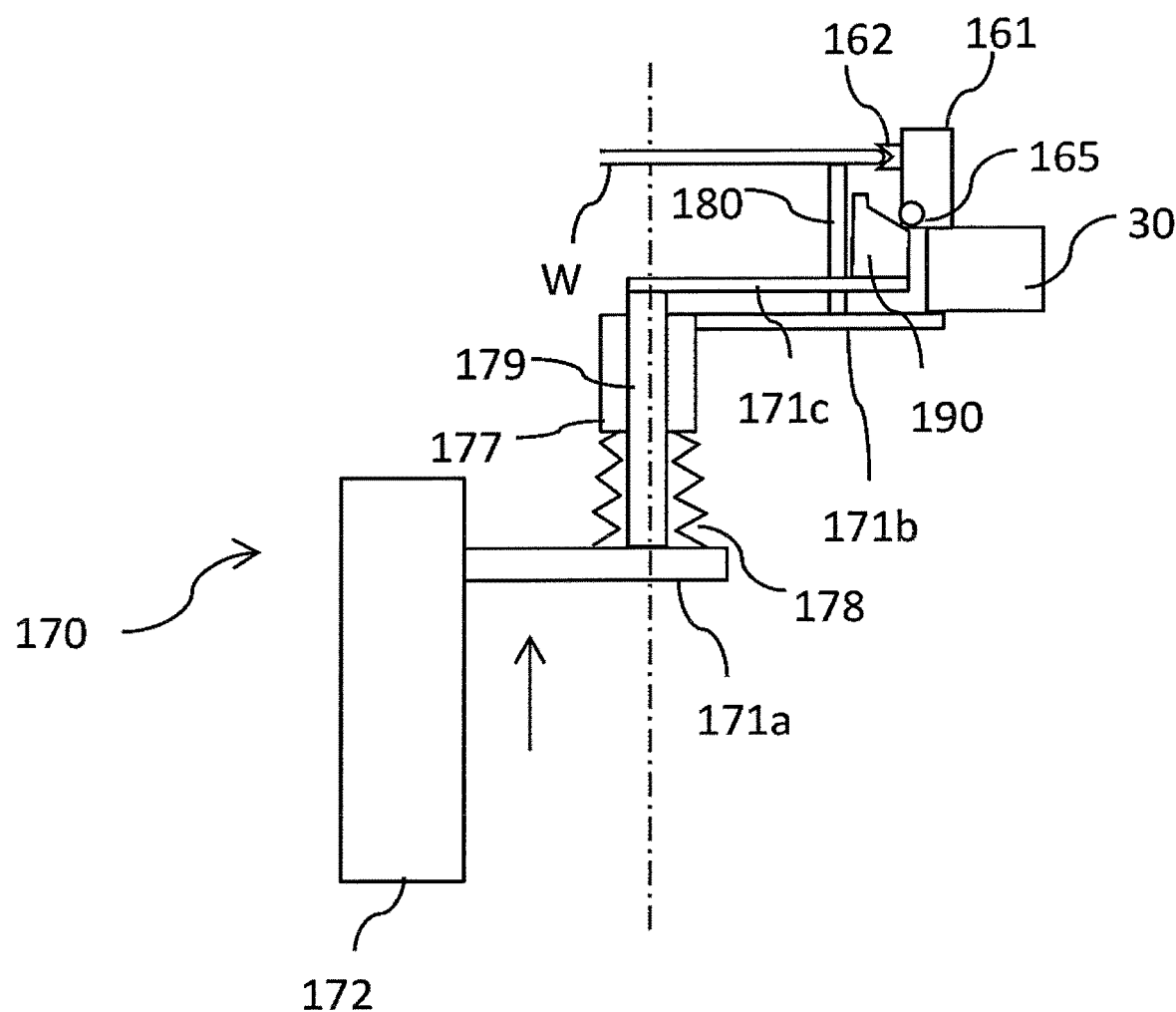
FIG. 21 is a side cross-sectional view showing an aspect in which the holding member and the opening device have moved to one side from the state shown in FIG. 20.

The configuration may be such that the second opening main body unit 171b is abuttable on a surface on the other side of the rotated unit 30, and when the second opening main body unit 171b is positioned at a position abutting on a surface on the other side of the rotated unit 30, the support member 180 is slightly in contact with the back surface of the substrate W or provides a small gap of around several millimeters with the back surface of the substrate W (refer to FIG. 21).

When this aspect is employed, when the first opening main body unit 171a is moved to the one side by the first direction movement unit 172, the second opening main body unit 171b and the third opening main body unit 171c are moved to the one side. When the second opening main body unit 171b moves up to a certain degree, the second opening main body unit 171b abuts on a surface on the other side of the rotated unit 30, and does not move further to the one side beyond that (refer to FIG. 21).

Figure 22:
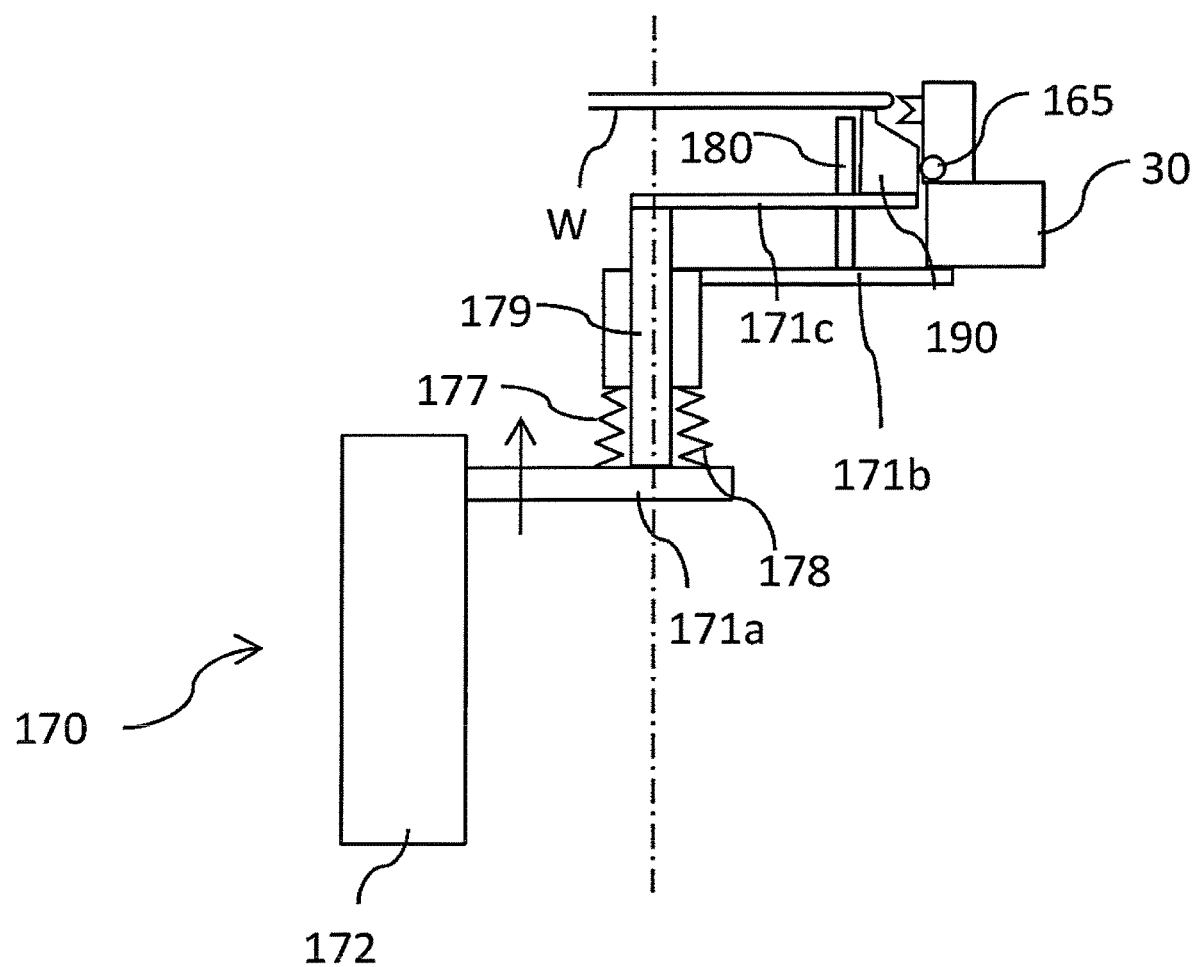
FIG. 22 is a side cross-sectional view showing an aspect in which the holding member and the opening device have moved further to one side from the state shown in FIG. 21.

With the first opening main body unit 171a moving further to the one side, the third opening main body unit 171c moves to the one side (refer to FIG. 22). Then, the pressing member 190 abuts on the pressed member 165 and presses the pressed member 165 in the in-plane direction. As a result, the holding member 162 becomes in the open state, and the support member 180 supports the back surface of the substrate W.

So far, the apparatus for cleaning the substrate having the first cleaning unit 10 and the second cleaning unit 20 has been described in the embodiments. However, the means for cleaning a substrate may be a chemical solution supply nozzle that supplies a chemical solution from a nozzle, or a nozzle that supplies a cleaning solution provided with an ultrasonic wave from a nozzle, and any means may be employed. Furthermore, the configuration including the rotating unit 35, the rotated unit 30, the holding unit 60, and the opening device 170 as main elements of the present embodiment may be applied not only to an apparatus for cleaning a substrate, but also to a variety of apparatuses for processing the substrate, such as an appatatus for drying a substrate, an appatatus for etching a substrate, an appatatus for application and an appatatus for plating. When the present invention is applied to the appatatus for drying the substrate, drying of a substrate may be performed by rotating the substrate held by a holding unit at high speed, or may be performed by an IPA vapor drying method using IPA vapor.

The disclosure of the description and the drawings of the embodiments described above is mere an example for explaining the invention described in claims. The invention described in claims is not limited by the disclosure of the description and the drawings of the embodiments described above. For example, an apparatus for processing a substrate having the apparatus for cleaning the substrate according to the present invention may include a bevel polishing device that polishes an end part of the substrate W, a back surface polishing device that performs polishing processing of the back surface of the substrate W, or a substrate plating device that forms a metal film on a surface of the substrate W. Furthermore, the substrate W in the present invention includes a semiconductor substrate, as well as a variety of types of substrates, such as glass substrates for a liquid crystal display device (LCD), for a plasma display (PDP), for an organic light emitting diode (OLED), for a field emission display, for a vacuum fluorescent display (VFD), for a solar cell panel, and the like, and glass and ceramic substrates and the like for magnetic and optical disks.

REFERENCE SIGNS LIST

10 First cleaning unit (cleaning unit)
11 First pencil cleaning member (first cleaning member)
12 First fluid jet cleaning member (first cleaning member)
15 First arm
16 First swinging shaft
20 Second cleaning unit (cleaning unit)
21 Second pencil cleaning member (second cleaning member)
22 Second fluid jet cleaning member (second cleaning member)
25 Second arm
26 Second swinging shaft
30 Rotated unit
35 Rotating unit
40 Rotation cup
45 Fixing cup
60 Holding unit
162 Holding member
163 Swinging shaft
165 Pressed member
167 Weight member
168 Projection unit
169 Elastic member
170 Opening device
180 Support member
190 Pressing member
W Substrate

The invention claimed is:

1. An apparatus for cleaning a substrate comprising:
a holding unit that holds the substrate;
a rotated unit connected to the holding unit;
a rotating unit that is provided on a peripheral outer side of the rotated unit and rotates the rotated unit;
a cleaning unit that physically cleans the substrate held by the holding unit; and
a rotation cup connected to the rotated unit, wherein
the rotated unit is provided at a lower end of the rotation cup, and
the holding unit is provided at an upper end of the rotated unit.

2. The apparatus for cleaning the substrate according to claim 1, wherein
the rotating unit rotates the rotated unit in a non-contacting state with the rotated unit.

3. The apparatus for cleaning the substrate according to claim 1, wherein
the cleaning unit has a first cleaning unit that physically cleans a first surface of the substrate and a second cleaning unit that physically cleans a second surface on an opposite side of the first surface.

4. The apparatus for cleaning the substrate according to claim 1, wherein
the cleaning unit physically cleans the substrate with 0.3 N or larger and 3 N or lower.

5. The apparatus for cleaning the substrate according to claim 1, wherein
the cleaning unit has a fluid jet cleaning unit that jets two fluids to the substrate.

6. The apparatus for cleaning the substrate, according to claim 1, further comprising
a fixing cup provided on a peripheral outer side of the rotation cup, wherein
the cleaning unit has a first cleaning unit that physically cleans a first surface of the substrate,
the first cleaning unit has a first arm that swings around a first swinging shaft, and a first cleaning member that is provided on a front-end side of the first arm and extends toward a side of the substrate and
the first cleaning member is positioned at a position away from the substrate relative to a front end of the fixing cup in a normal direction of the substrate and on a peripheral outer side of a front end of the fixing cup at a time of standby.

7. The apparatus for cleaning the substrate according to claim 1, wherein
the cleaning unit has a second cleaning unit that physically cleans a second surface of the substrate,
the second cleaning unit has a second arm that swings around a second swinging shaft, and a second cleaning member that is provided on a front-end side of the second arm and extends toward a side of the substrate and
the second cleaning unit is positioned at a position away from the substrate relative to the rotated unit in a normal direction of the substrate at a time of standby.

8. An apparatus for cleaning a substrate comprising:
a holding unit that has a holding member holding the substrate and an elastic member that provides a biasing force to the holding member a rotated unit connected to the holding unit;

a rotating unit that is provided on a peripheral outer side of the rotated unit and rotates the rotated unit;

a cleaning unit that physically cleans the substrate held by the holding unit; and the apparatus for cleaning the substrate further comprising an opening device that moves the holding member to an open state by providing a force opposite to a biasing force applied by the elastic member.

9. The apparatus for cleaning the substrate according to claim 8, wherein the opening device approaches the holding unit from a front surface side of the substrate and moves the holding member to the open state.

10. The apparatus for cleaning the substrate according to claim 8, wherein the opening device has a support member that supports a back surface of the substrate when the holding member is in the open state.

11. The apparatus for cleaning the substrate according to claim 10, wherein the support member approaches from a front surface side of the substrate, moves to a back-surface side of the substrate, is positioned on the back-surface side of the substrate before the holding member becomes in the open state, and supports the back surface of the substrate when the holding member is in the open state.

12. The apparatus for cleaning the substrate, according to claim 11, further comprising a rotation cup connected to the holding unit or the rotated unit, wherein the support member is positioned on the back-surface side of the substrate after passing through a peripheral inner side of the rotation cup and a peripheral outer side of the substrate.

13. The apparatus for cleaning the substrate according to claim 8, wherein the opening device has a pressing member that moves along an in-plane direction of the substrate, the holding unit has a pressed member pressed by the pressing member, and the holding member becomes in the open state by the pressed member being pressed by the pressing member.

14. The apparatus for cleaning the substrate, according to claim 13, further comprising a rotation cup connected to the holding unit or the rotated unit, wherein the pressed member is provided between an inner periphery of the rotation cup and an outer periphery of the substrate when viewed from a front surface side of the substrate.

15. The apparatus for cleaning the substrate according to claim 8, wherein the holding unit has a swinging shaft that has the holding member swing along an in-plane direction of the substrate.

16. The apparatus for cleaning the substrate according to claim 15, wherein the holding unit has a weight member provided closer to a base end relative to the swinging shaft.

17. The apparatus for cleaning the substrate according to claim 8, wherein the holding unit has a plurality of holding members, and a first biasing force provided to a certain holding member is larger than a second biasing force provided to another holding member.

18. The apparatus for cleaning the substrate according to claim 17, wherein the holding unit has a regulated unit for regulating movement to an inner peripheral side of the holding member, the rotated unit has a regulating unit for regulating movement of the regulated unit, and movement of a holding member, provided with the first biasing force, to an inner side is regulated by the regulating unit on a peripheral outer side relative to a holding member provided with the second biasing force.

19. The apparatus for cleaning the substrate, according to claim 1, further comprising a member including a conductive fiber and being provided adjacent to the holding unit.

20. An apparatus for cleaning a substrate comprising:

a chuck that holds the substrate;

a rotated unit connected to the chuck;

a stator that is provided on a peripheral outer side of the rotated unit and rotates the rotated unit;

a fluid jet cleaning unit or a pencil cleaning unit that physically cleans the substrate held by the chuck; and a rotation cup connected to the rotated unit, wherein the rotated unit is provided at a lower end of the rotation cup, and the chuck is provided at an upper end of the rotated unit.

21. An apparatus for cleaning a substrate comprising:

a holding unit that has a chuck holding the substrate and an elastic member that provides a biasing force to the chuck, a rotated unit connected to the chuck;

a stator that is provided on a peripheral outer side of the rotated unit and rotates the rotated unit;

a fluid jet cleaning unit or a pencil cleaning unit that physically cleans the substrate held by the chuck; and an opening device that has a main body unit, a movement unit that moves the main body unit along a first direction and a pressing member, and that makes the chuck to an open state by providing a force via the pressing member opposite to a biasing force applied by the elastic member.

* * * * *